(12) United States Patent
Ouellet et al.

(10) Patent No.: US 6,902,656 B2
(45) Date of Patent: Jun. 7, 2005

(54) FABRICATION OF MICROSTRUCTURES WITH VACUUM-SEALED CAVITY

(75) Inventors: Luc Ouellet, Granby (CA); Robert Antaki, St-Luc (CA); Yves Tremblay, Brigham (CA)

(73) Assignee: DALSA Semiconductor Inc., Waterloo (CA)

( * ) Notice: Subject to any disclaimer, the term of this patent is extended or adjusted under 35 U.S.C. 154(b) by 220 days.

(21) Appl. No.: 10/153,593

(22) Filed: May 24, 2002

(65) Prior Publication Data

US 2003/0217915 A1 Nov. 27, 2003

(51) Int. Cl.$^7$ .......................... C23C 14/35; H01L 21/00
(52) U.S. Cl. ........................ 204/192.16; 204/192.17; 438/26; 438/51; 438/52; 438/53; 438/106; 438/124; 438/127; 438/694; 438/700; 438/702; 438/703
(58) Field of Search ................. 204/192.16, 192.17; 438/26, 51, 52, 53, 106, 124, 127, 694, 700, 702, 703

(56) References Cited

U.S. PATENT DOCUMENTS

| | | | | |
|---|---|---|---|---|
| 4,838,088 A | * | 6/1989 | Murakami | 73/724 |
| 5,188,983 A | | 2/1993 | Guckel et al. | |
| 5,589,082 A | | 12/1996 | Lin et al. | 216/2 |
| 5,631,428 A | * | 5/1997 | Catanescu et al. | 73/724 |
| 5,668,033 A | | 9/1997 | Ohara et al. | 438/113 |
| 5,783,749 A | | 7/1998 | Lee et al. | 73/504.12 |
| 5,937,275 A | | 8/1999 | Munzel et al. | 438/50 |
| 5,952,572 A | | 9/1999 | Yamashita et al. | 73/504.04 |
| 6,133,146 A | | 10/2000 | Martinez-Tovar et al. | |
| 6,140,144 A | | 10/2000 | Najafi et al. | 438/53 |
| 6,232,150 B1 | | 5/2001 | Lin et al. | 438/119 |
| 6,265,246 B1 | | 7/2001 | Ruby et al. | 438/113 |
| 6,297,072 B1 | | 10/2001 | Tilmans et al. | 438/106 |
| 6,335,224 B1 | | 1/2002 | Peterson et al. | 438/114 |
| 6,635,509 B1 | * | 10/2003 | Ouellet | 438/106 |

FOREIGN PATENT DOCUMENTS

| | | |
|---|---|---|
| EP | 1 352 877 | 10/2003 |
| WO | WO 00/12987 | 3/2000 |

OTHER PUBLICATIONS (1) "A mixed micromachine differential resonant accelerometer", Byeungleul Lee et al.
(2) "A vacuum packaged differential resonant accelerometer using gap sensitive electrostatic stiffness changing effect", Byeung–leul Lee et al.
(3) "A fabrication process for integrating polysilicon microstructures with post–processed CMOS circuits", Y.B. Gianchandani et al., J. Micromech.Microeng., pp. 380–386.
(4) "RF MEMS switches and switch circuits", Gabriel M. Rebeiz et al., IEEE Microwave magazine, pp. 59–64.
(5) "Comprehensive study of processing parameters influencing the stress and stress gradient of thick polysilicon layers", Matthias Furtsch et al., SPIE vol. 3223, pp. 130–141.
(6) "Surface micro–machined encapsulation on wafer level", SUMICAP, pp. 1–7.

(Continued)

Primary Examiner—Rodney G. McDonald
(74) Attorney, Agent, or Firm—Marks & Clerk

(57) ABSTRACT

A cavity forming formed in an encapsulation structure under a vacuum in a vacuum chamber is sealed with a capping layer. A stiff protective layer under tensile stress is deposited on the capping layer prior to venting the vacuum chamber to atmospheric pressure. The capping layer is preferably aluminum or an aluminum alloy, and the protective layer is preferably δ-TiN having a suitable high Young's modulus.

29 Claims, 27 Drawing Sheets

OTHER PUBLICATIONS (7) "Effect of specimen size on young's modulus and fracture strength of polysilicon", William N. Sharpe, Jr., et al., Journal of Microelectromechanical Systems, vol. 10, No. 3, Sep. 2001, pp. 317–327.

(8) "Microfabricated polysilicon microneedles for minimally invasive biomedical devices", Jeffery D. Zahn et al., Biomedical Microdevices 2:4, pp. 295–303.

(9) "X–ray analysis of protective coatings", Edzo Zoestbergen.

(10) "Alteration of residual stress in TIN film due to heat treatment", Tetsuya Matsue et al., Original paper (vol. 49, No. 7, p. 735).

(11) Texture development in titanium nitride films grown by low–energy ion assisted deposition, B. Rauschenbach et al., Cryst. Res. Technol. pp. 675–688.

(12) "Surface modification of titanium with lasers", Annejan Kloosterman.

(13) "The BOSCH foundry service", K8/SPP4.

* cited by examiner

Figure 1
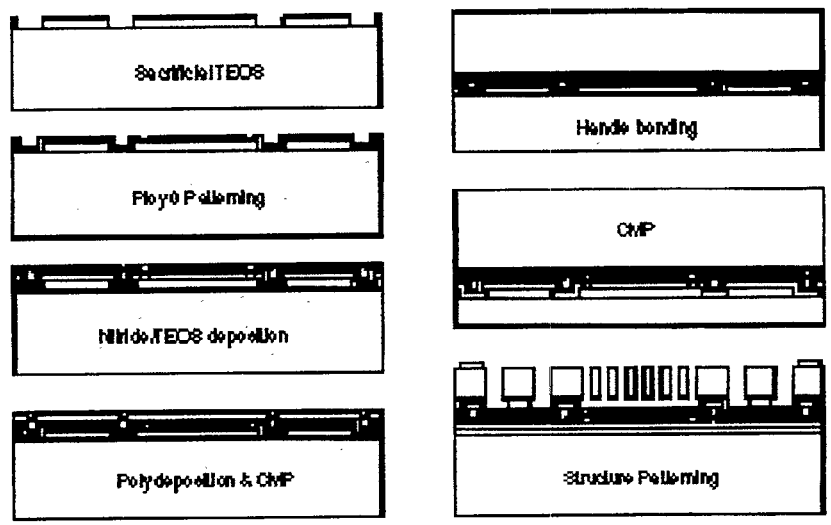
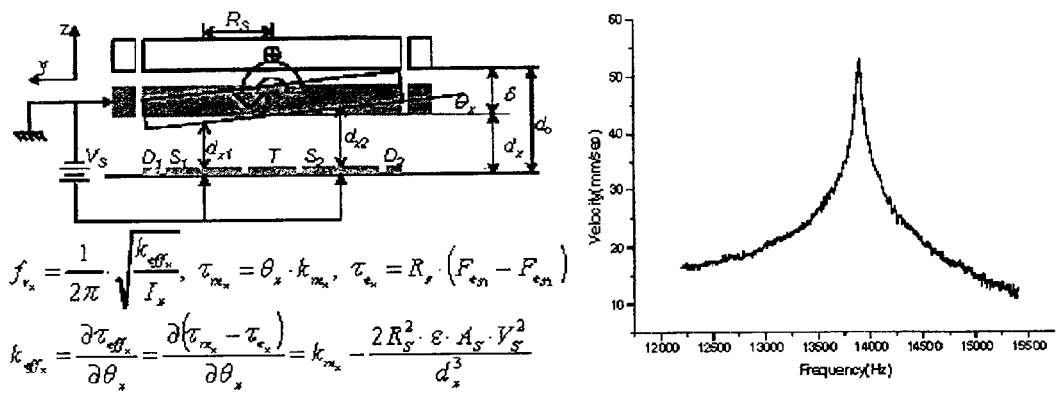
PRIOR ART

Figure 2
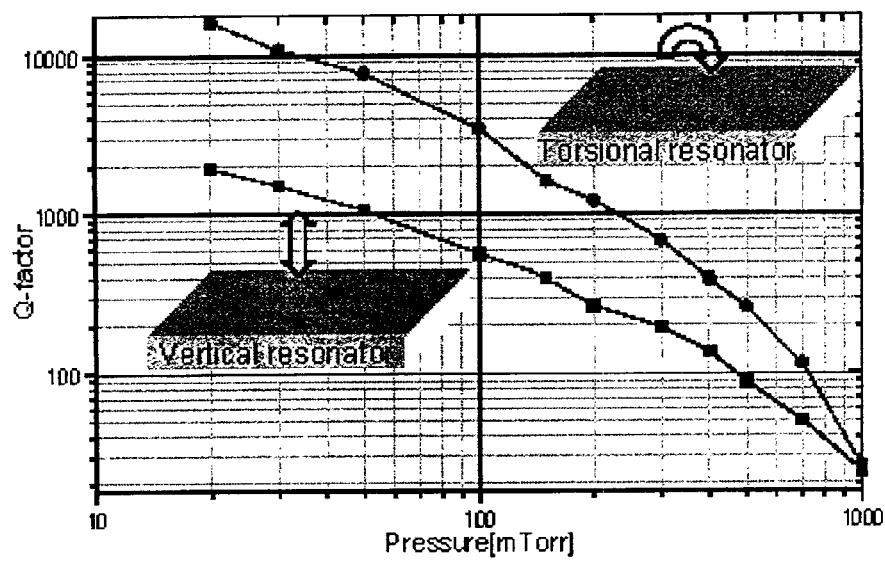
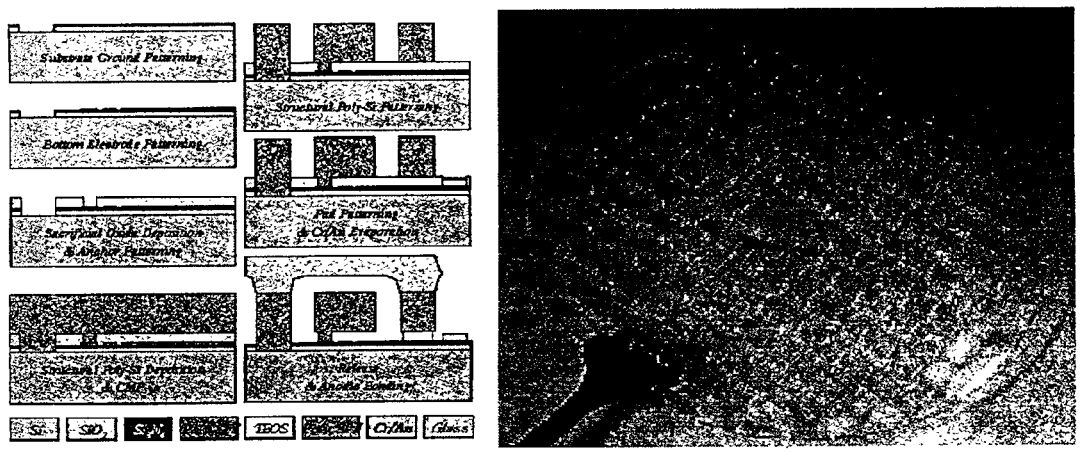
PRIOR ART

PRIOR ART

Figure 4
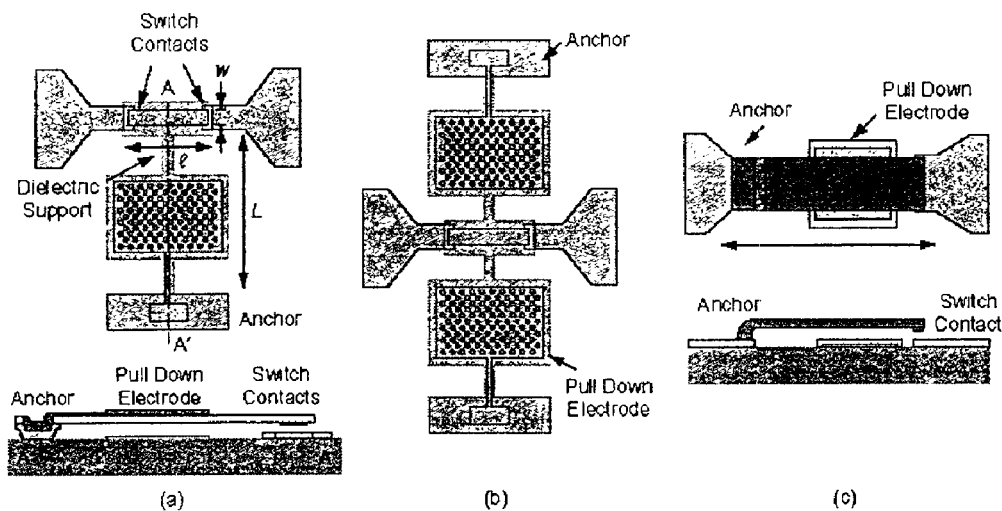
Broadside MEMS-series switches with
a) One electrode; b) Two electrodes; c) InlineMEMS-series switches
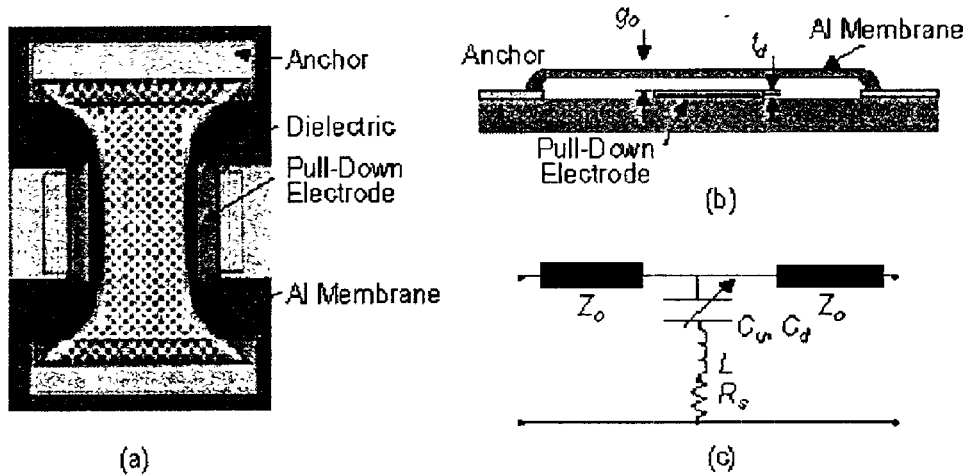
Raytheon MEMS capacitive shunt switch:
d) Cross-section view; e) Electrical CLR model
PRIOR ART

Released Structural ISDP

PRIOR ART

10
11
12

PRIOR ART

PRIOR ART

Figure 8 (cont)
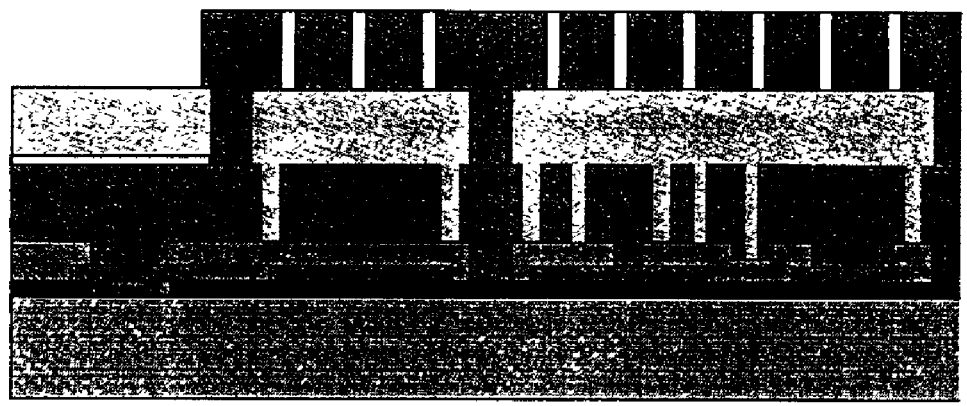
n)
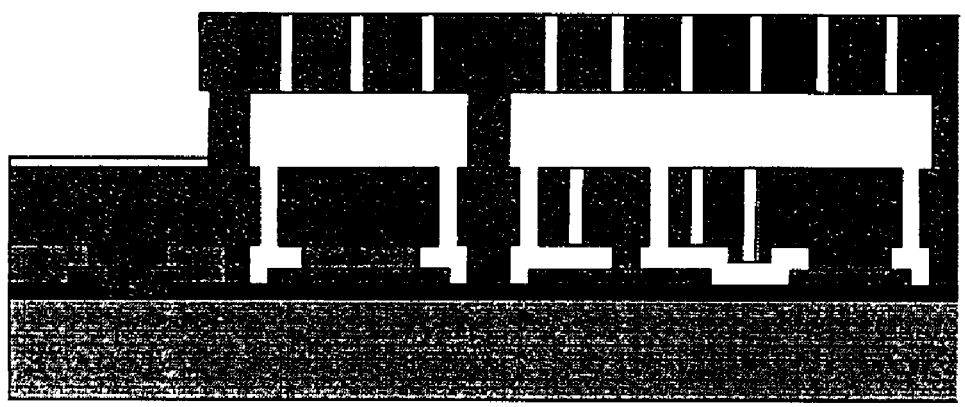
o)
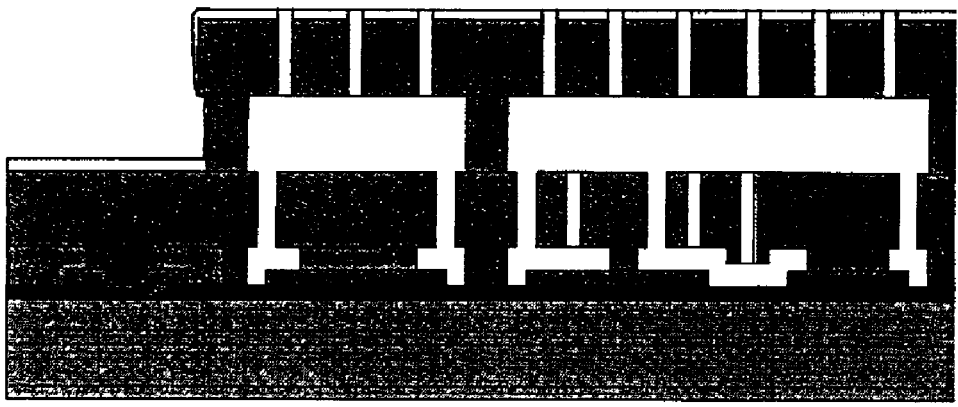
p)

Figure 8 (cont)
q) 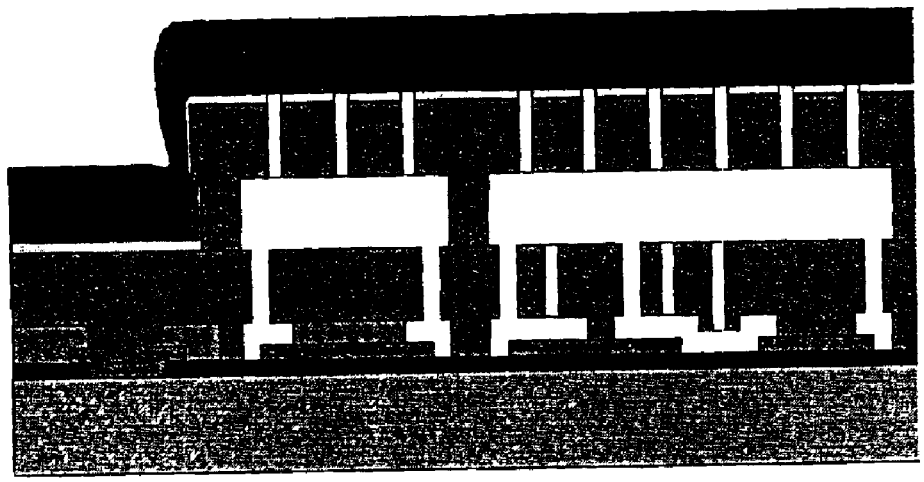
r) 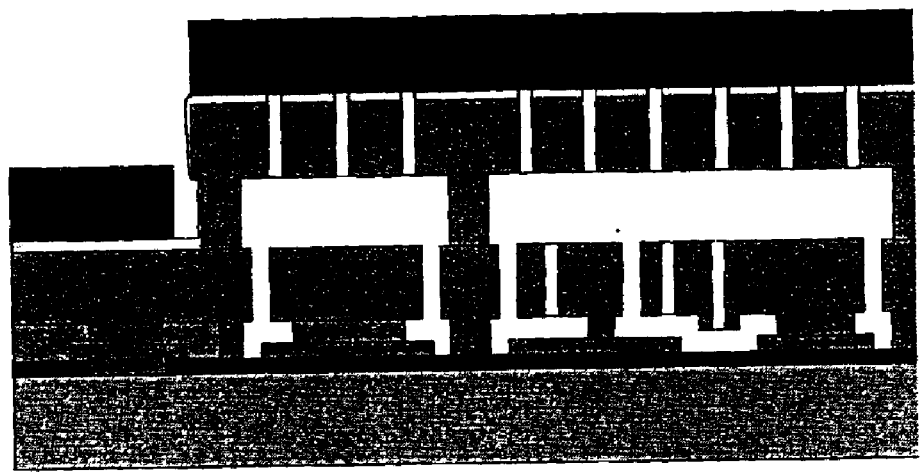
s) 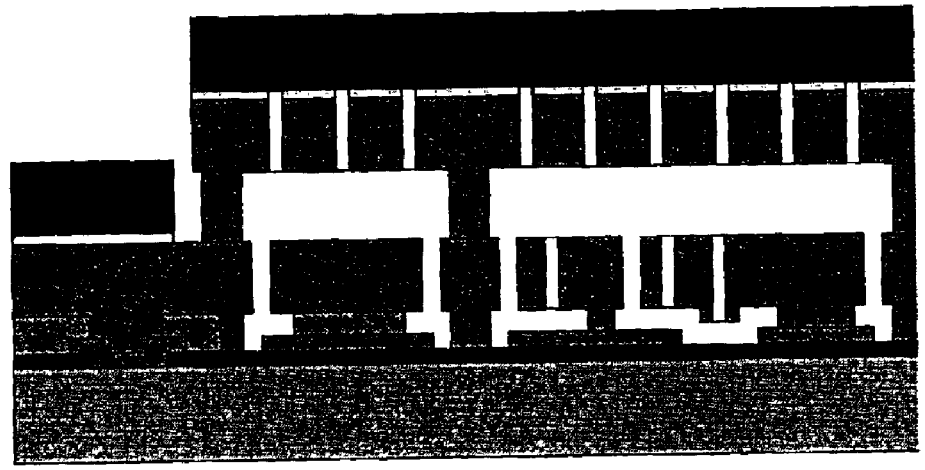

t)

Figure 9
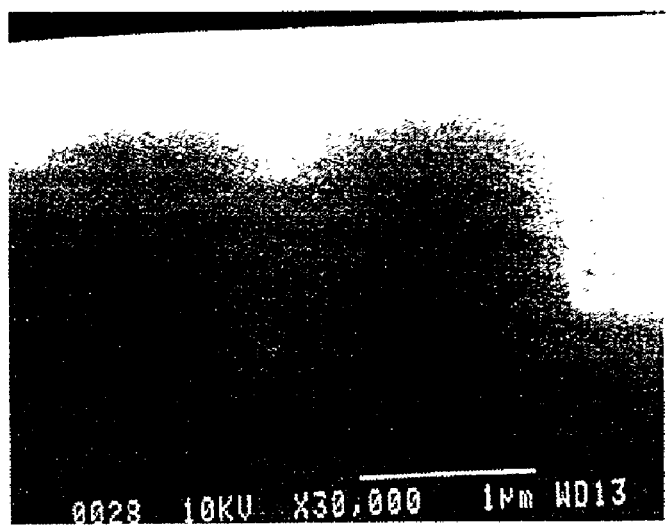
Polysilicon deposited by LPCVD at 620°C
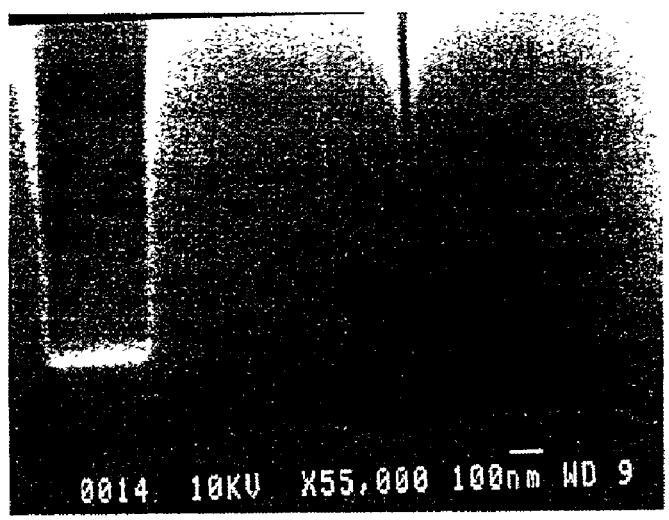
Silicon nitride deposited by LPCVD at 800°C $$P(w_0) = c_1 \frac{\sigma_0 h}{a^2} w_0 + c_3(v) \frac{Eh}{a^4(1-v)} w_0^3 ,$$

*For square cavities :*
*c1 = 13.64;*
*c3(v) = 31.70 − 9.360 v*

Figure 15

| Preferred In-situ Material | Young's Modulus (E, GPa) | Yield Strength (GPa) | Poisson's Coefficient (v) | Mass Density (g/cc) | References |
|---|---|---|---|---|---|
| TiN | 600 | 0.97 | 0.232 | 5.31 | Thin Solid Films, 270(1995), p 266, E. Zoestbergen, Ph.D Thesis, University Library Groningen |
| TiAlN | 450 | | 0.177 | | E. Zoestbergen, Ph.D Thesis, University Library Groningen |
| $MoSi_2$ | 439 | 0.34 | 0.16 | 6.26 | Thin Solid Films, 214(1992), p 56 CRC Materials Science and Eng. Handbook, pp 408, 512 |
| TiC | 435 | 0.295 | 0.240 | 4.92 | E. Zoestbergen, Thesis, University Library Groningen A.B. Kloosterman, Thesis, University Library Groningen |
| SiC | 415 | 0.355 | 0.150 | 3.22 | A.B. Kloosterman, Thesis, University Library Groningen |
| W | 405 | 3.4 | 0.28 | 19.3 | IEEE MEMS Workshop, Feb 1990, Napa, CA, p.174 Arthur L. Ruo, The Elastic Moduli of W |
| AlN | 350 | 0.27 | 0.25 | 3.30 | Thin solid films 290-291(1996), p 309 CRC Materials Science and Engineering Handbook, p.533 |
| TiAl | 270 | 1.5 | 0.25 | 3.60 | Thin Solid Films, 270(1995), p 263 CRC Materials Science and Eng. Handbook, p 270-274 |
| Mo | 255 | 0.480 | 0.32 | 10.2 | Proceedings of IEEE, Vol 70, No 5, May 1982, p 421 A.B. Kloosterman, Thesis, University Library Groningen |
| Ta | 186 | 0.480 | 0.26 | 16.6 | CRC Materials Science and Eng. Handbook, p 270-274 http://www.rembar.com/tech2.htm#chart2 |
| Pt | 170 | 1.0 | 0.20 | 21.4 | IEEE MEMS Workshop, Feb 1990, Napa, CA, p.174; CRC Materials Science and Engineering Handbook |
| $WSi_2$ | 120 | 0.30 | 0.18 | 9.25 | CRC Materials Science and Eng. Handbook, pp.408, 512 June 12-13, 1990 VMIC Conference, p 262 |
| Ti | 102 | 0.172 | 0.36 | 4.51 | Thin Solid Films, 270 (1995), p 263; A.B. Kloosterman, Thesis, University Library Groningen |
| Au | 80 | 0.21 | 0.42 | 19.3 | IEEE MEMS Workshop, Feb 1993, Florida, p 25; J. Microelectromechanical syst., V 10, No 2, p 302 |
| Al | 70 | 0.20 | 0.33 | 2.70 | IEEE MEMS Workshop, Feb 1990, p.174; AAE 320/ME 345 - ANSYS Lab #2 |

Figure 16

| Other reference Materials | Young's Modulus (E, GPa) | Yield Strength (GPa) | Poisson's Coefficient (v) | Mass Density (g/cc) | References |
|---|---|---|---|---|---|
| LPCVD Si$_3$N$_4$ | 380 | 2.0 | 0.28 | 3.10 | IEEE MEMS Workshop, Feb 1990, Napa, CA, p.174<br>38$^{th}$ IEEE IRPS Proc, San Jose, CA, 2000, p. 283<br>Thin Solid Films, 290-291 (1996), p 309 |
| Si substrate | 200 | 3.20 | 0.27 | 2.27 | J Mater. Res, Vol. 12, No.1, Jan1997, p 59<br>W Sharpe, 10th MEMS Workshop, 1997, p. 424<br>Biomedical Microdevices 2.4, 2000, p 295-303 |
| Polysilicon | 169 | 1.2 | 0.22 | 2.27 | J Mater. Res, Vol 12, No 1, Jan1997, p.59<br>W Sharpe, 10th MEMS Workshop, 1997, p. 424<br>Biomedical Microdevices 2.4, 2000, p 295-303 |
| PECVD Si$_3$N$_4$ | 160 | 1.0 | 0.25 | 3.18 | IEEE MEMS Workshop, Feb 1990, Napa, CA, p 174<br>38$^{th}$ IEEE IRPS Proc, San Jose, CA, 2000, p 283<br>Thin Solid Films, 290-291 (1996), p.309 |
| SiO$_2$ | 83 | 0.60 | 0.17 | 2.23 | IEEE MEMS Workshop, Feb 1990, Napa, CA, p.174;<br>IEEE MEMS Workshop, Feb 1993, Florida, p 25;<br>J Mater Res, 3(5):931-942, 1988 |

C

FABRICATION OF MICROSTRUCTURES WITH VACUUM-SEALED CAVITY

BACKGROUND OF THE INVENTION

1. Field of the Invention

This invention relates to the fabrication of microstructures, and in particular to the fabrication of microstructures with a vacuum-sealed cavity, for example containing a moving component, and further to the manufacture of Micro-Electro-Mechanical-Systems (MEMS), such as micro-gyroscopes, micro-accelerometers, resonant accelerometers, micro-mirrors, micro-motors, micro-actuators and other such micro-devices.

2. Description of Related Art

The integration of micro-devices with a moving component creates a very serious packaging challenge for several reasons. Some MEMS-based devices require the encapsulation to be done before dicing so that they are protected against micro-contamination from particles and dicing slurry while being processed like a standard semiconductor chip, without the need for dedicated equipment or processes for dicing, mounting and molding procedures inside the cleanrooms. Changes in atmospheric conditions can change the capacitance readout of micro-gyroscopes and micro-accelerometers without any changes in acceleration and because an increased relative humidity can increase friction of their moving parts, it is necessary to encapsulate their moving and/or particular components in vacuum or in a controlled atmosphere. Most MEMS-based resonant accelerometers, MEMS-based RF switching devices and other such MEMS devices have very serious Q-factor degradation when exposed to an ambient pressure exceeding 1 Pa. Their moving MEMS components require a vacuum packaging to a residual pressure of less than 1 Pa to ensure a reliable service during its complete projected life.

U.S. Pat. No. 5,589,082, entitled, "Microelectromechanical signal processor fabrication", the contents of which are incorporate by reference herein, discloses a first example of such protective packaging. The micro-cavity described in this patent is used to protect a micro-mechanical resonator and is formed using a vacuum sealed silicon nitride micro-shell fabricated by properly micromachining the micro-mechanical resonator in a certain fabrication step; depositing a 7.0 $\mu$m thick phosphosilicate (PSG) layer over the micro-machined micro-mechanical resonator; patterning the 7.0 $\mu$m thick PSG layer into an isolated island covering the moving and/or particular component of the micromachined micro-mechanical resonator and defining the shape of the micro-shell; depositing an extra 1.0 $\mu$m thick PSG layer; patterning the lateral etch-channels at the periphery of the isolated island; depositing an extra 1.0 $\mu$m thick LPCVD low-stress silicon nitride; patterning the lateral etch holes in the silicon nitride located at the periphery of the isolated island; releasing the micro-mechanical resonator using concentrated HF penetration through the lateral etch holes formed at the periphery of the isolated island of all sacrificial material located under and over (7.0 $\mu$m thick PSG layer) the moving and/or particular component of the micromachined micro-mechanical resonator, leaving the formed 1.0 $\mu$m thick LPCVD low-stress silicon nitride micro-shell intact; and sealing of the lateral etch holes formed at the periphery of the formed micro-shell using a 2.0 $\mu$m thick layer of silicon nitride deposited over the suspended 1.0 $\mu$m thick LPCVD low-stress silicon nitride micro-shell, as to form a 3.0 $\mu$m thick LPCVD low-stress silicon nitride micro-shell.

As indicated in this patent at column 11, lines 7–12, the release of the micro-mechanical resonator using concentrated HF through the lateral etch holes formed at the periphery of the silicon micro-shell limits the size of the micro-device to about 500 $\mu$m×500 $\mu$m due to incomplete sacrificial material removal away from the periphery of the micro-shell; and collapse of the 3.0 $\mu$m thick LPCVD low-stress silicon nitride micro-shell upon exposure to atmospheric pressure.

A second example of protective packaging is given in U.S. Pat. No. 5,668,033 entitled 'Method for manufacturing a semiconductor acceleration sensor device'. The packaging technique described this patent and used to fabricate the packaging structure covering the acceleration sensor uses a gold-silicon (case where a silicon-on-insulator substrate is used) or a gold-polysilicon eutectic bonding technique. This technique requires the bonding of two substrates.

A third example of protective packaging is disclosed in U.S. Pat. No. 5,783,749 entitled 'Vibrating disk type micro-gyroscope' (Electronics and telecommunications research Institute). The vacuum sealed packaging structure covering the gyroscope to maintain a 1 mTorr pressure to enhance its sensitivity and to minimise air damping uses an unknown bonding technique. This technique also requires the bonding of two elements, i.e. of a sealed structure and of a substrate, as indicated in column 3, lines 25–31.

A fourth example of protective packaging is disclosed in U.S. Pat. No. 5,952,572 entitled 'Angular rate sensor and acceleration sensor' (Matsushita Electric Industrial Co., Ltd.). Three substrates composing the angular rate sensor are bonded together as a sandwich structure using anodic bonding, as mentioned in column 7, lines 36–41. This anodic bonding requires the silicon and glass substrates to be heated at 300–400° C. in a vacuum while a negative voltage of about 1000V in terms of reference potential of the silicon substrate is applied to the glass substrates. As mentioned at column 7, lines 55–58, a Zr—V—Fe/Ti non-volatile getter material is also integrated in the sealed cavity to maintain the vacuum quality. This technique also requires the bonding of two substrates.

A fifth example of such protective packaging is provided by U.S. Pat. No. 6,140,144 entitled 'Method for packaging microsensors' (Integrating Sensing Systems, Inc.). Two substrates composing the microsensors are bonded together by flip chip bonding using an underfill material as to maintain a controlled pressure/controlled environment around the sensing element, as mentioned in column 3, lines 48–50. This technique also requires the bonding of two substrates.

A sixth example of such protective packaging is given in U.S. Pat. No. 6,232,150 entitled 'Process for making microstructures and microstructures made thereby' (The Regents of the University of Michigan). The two substrates composing the microstructures described are bonded together with a localised micro-heater flip chip bonding technique using a bonding material and a metal-based localised resistive micro-heater capable of locally heating the bonding material as to provoke the bonding of the two substrates, as mentioned in column 4, lines 25–35. This technique also requires the bonding of two substrates.

A seventh example of such protective packaging is given in U.S. Pat. No. 6,265,246 entitled 'Microcap wafer-level package' (Agilent Technologies, Inc.). The base wafer integrating a micro-device is bonded to a matching cap wafer using cold welding of the bonding pad gaskets of the cap wafer to the periphery of the bonding pads of the base wafer integrating the micro-device. The arrangement assures a hermetic seal of the wafer-level package and electrical connections to the micro-device without passing through a seal. This technique also requires the bonding of two substrates.

An eighth example of such protective packaging is given in U.S. Pat. No. 6,297,072 entitled 'Formation of a microstructure having an internal cavity' (Interuniversitair Micro-Electronika Centrum, IMEC, VZW). A first chip located on first substrate covered with antimony-copper or antimony-nickel/gold metallization seed layer forming a stable intermetallic compound with a selected solder is bonded to a second chip located on a second substrate also covered with antimony-copper or antimony-nickel/gold metallization seed layer via an antimony-lead, an antimony-lead-silver, an indium, a gold-antimony, an antimony-silver, an antimony-silver-copper or an antimony-bismuth electroplated solder ring capable of being reflowed at 200–350° C. as to create an enclosed vacuum or controlled ambient cavity. This technique also requires the bonding of two substrates.

A ninth example of such protective packaging is given in U.S. Pat. No. 6,335,224 titled 'Protection of microelectronic devices during packaging' (Sandia Corporation). A released MEMS element is protected by a water-insoluble vacuum vapor deposited conformal and dry-etchable temporary protective coating, such as parylene, during dicing, allowing its protection against micro-contamination. This protective coating is later removed using an oxygen plasma when the diced MEMS or IMEMS device substrate is bonded to the package and when the bond pads of the MEMS device are electrically connected to the external electrical leads with bond wires. Following the removal of the protective coating, a cover lid including an optional optical window is bonded to the package protecting the released MEMS element. This technique requires a temporary protective coating to be removed using an oxygen plasma during die packaging, just prior to cover lid bonding.

A tenth example of the importance of such protective packaging is described by Samsung Corporation in a number of papers. As shown in FIG. 1, the paper by B. Lee, S. Seok, J. Kim, and K. Chun, 'A mixed micromachined differential resonant accelerometer', Work supported by ADD (Agency for Defense Development) through ACRC (Automatic Control Research Center) under Grant AC-041 and by the Brain Korea21 Project, discloses a vacuum packaging technique using anodic bonding of a handle glass wafer to a Chemical-Mechanical Polished (CMP) 6 $\mu$m thick polysilicon deposited on a previously deposited and patterned TEOS sacrificial layer, polysilicon electrodes and dielectric isolation layers on a silicon substrate which is flipped-over and CMPed again on its back side to a thickness of 40 $\mu$m, then micromachined using deep RIE (Reactive Ion Etching), released to produce the MEMS accelerometer and then anodically bonded to another glass substrate under vacuum to produce a vacuum sealed accelerometer.

As shown in FIG. 2, the paper by B. Lee, C. Oh, S. Lee, Y. Oh and K. Chun, 'A vacuum packaged differential resonant accelerometer using gap sensitive electrostatic stiffness change effect', Work supported by ADD (Agency for Defense Development) through ACRC (Automatic Control Research Center) under Grant AC-04, describes Samsung's use of anodic bonding of two substrates to produce the accelerometers, but here shows the effect of the vacuum level around the accelerometer on the Q-factor of its parallel plate resonators. The presence of residual gas (air) is the cause of the observed damping effect. This reference discusses the effect or residual gases on the performance of MEMS devices and explains the need for a vacuum sealed approach.

As shown in FIG. 3, the paper by Y. Gianchandani, H. Kim, M. Chinn, B. Ha, B. Lee, K. Najafi and C. Song, 'A fabrication process for integrating polysilicon microstructures with post-processed CMOS circuitry', J. Micromech. Microeng. Vol 10 (2000), pp. 380–386, describes Samsung's 18 mask (22 lithography steps) process using a machined 2 $\mu$m thick third polysilicon to protect a double polysilicon but not-yet-released MEMS accelerometer or gyroscope recessed in a 6 $\mu$m deep valley. Following standard LOCOS-based CMOS processing outside the location of this machined third polysilicon region protected by a 1.0 $\mu$m thick oxide and 0.12 $\mu$m thick LPCVD silicon nitride combination layers and involving a 16 hour duration p-well drive-in diffusion at 1200° C. in a nitrogen/oxygen ambient, the MEMS structure under the third polysilicon layer is released using a wet HF of buffered HF (BHF) etch penetrating the forming underlying cavity from the sides. Following this releasing step, photoresist is used to protect the CMOS circuitry including aluminum-based interconnects. No details are given about the packaging of the released structures.

An eleventh example of the importance of packaging is described in the paper by G.M. Rebeiz and J.B. Muldavin, 'RF MEMS switches and switch circuits', IEEE Microwave Magazine, December 2001, pp. 59–64. This paper indicates that MEMS based RF switches need to be packaged in inert atmospheres (nitrogen, argon, etc) and in very low humidity, resulting in hermetic or near-hermetic seals. It indicates that packaging costs are currently high and that the packaging technique itself may adversely affect the reliability of the MEMS switch. This paper reference indicates that since RF switches follow standard Newtonian's mechanics and, more specifically d'Alambert's equation of motion:

$$mg''+bg'+k(g_o-g)=F_e$$

where m, and b are the mass and damping coefficient of the vibrating cantilever, shown in FIG. 4, g is the gap between the electrodes, k is the equivalent spring constant of the resonant frequency:

$$\overline{\omega}_o=(k/m)^{1/2}$$

m is the mass of the oscillating part and Fe is the electrical force given by:

$$2F_e=\epsilon AV^2/(g+t_d/\epsilon_r)^2$$

where $\epsilon$ is vacuum's permittivity constant, A is the area of the electrodes, V is the voltage divergence between the electrodes while $t_d$ and $\epsilon_r$ are respectively the thickness and dielectric constant of the dielectric deposited over the fixed electrode. To the damping coefficient, b, of this motion equation is associated the very important quality, Q, factor:

$$Q=k/\overline{\omega}_o b$$

This quality factor has to be as high as possible in order to allow high switching capability. Unfortunately, damping is limited by squeeze-film effect (removing the air underneath the cantilever) to about 0.2 to 5.0 for most designs at atmospheric pressure and can exceed 50–1000 when operated under vacuum.

U.S. Pat. No. 5,937,275 titled 'Method of producing acceleration sensors' (2.10.1. Robert Bosch GmbH), claims a method for producing sensors, especially acceleration sensors in which on a substrate (1) with a sacrificial layer (2), in an epitaxial application system, a silicon layer (4) is deposited that is deposited above the sacrificial layer (2) as a polysilicon layer (6), a first photoresist layer (7) being applied to the polysilicon layer (6) and being structured by optical methods as an etching mask, and structures (8) being introduced into the polysilicon layer (6) through the etching mask, which structures extend from the top side of the polysilicon layer (6) as far as the sacrificial layer (2), a sacrificial layer (2) being removed from beneath the structures (8), characterized in that the surface of the polysilicon layer (6) is post-machined in a smoothing process before the first photoresist layer (7) is applied. Amongst other things, additional claims cover the use of a photoresist plasma etch-back planarization process for the polysilicon layer, a chemical-mechanical polishing process of the polysilicon layer, a polysilicon starter layer under the polysilicon layer, a polysilicon layer over the sacrificial layer simultaneously to an epitaxial growth over the regions where no sacrificial layer is provided. This patent does not describe the protective cavity that Robert Bosch GmbH currently uses around the moving and/or particular component of its MEMS devices.

FIG. 5 shows an example of the surface micromachining performed at Robert Bosch GmbH, as reported on the Europractice web site: http://www.europractice.bosch.com/en/download/customer_support.pdf. In this technique a 380 $\mu$m thick cap wafer 11 and frit bonding 12 is used as to form a 75 $\mu$m high protective cavity over the 10.3 $\mu$m thick released polysilicon structures containing a gyroscope 10. Some details of this surface micromachining process are also available in the paper by M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin Tex., Sep. 29–30, 1997.

In the process described in Furtsch's paper, the starting material is a 150mm (100) N-type 1–2 $\Omega$.cm resistivity silicon wafer. The 2.5 $\mu$m thick Pad oxide is thermally grown on the substrate. The 0.45 $\mu$m thick Surface polysilicon layer is deposited using a standard 630° C. Low Pressure Chemical Vapor Deposition (LPCVD) process. The 0.45 $\mu$m thick Surface polysilicon layer is implanted with antimony and annealed at 1000° C. in an oxygen ambient to drive and activate the Sb dopant. There is no indication about the fabrication technique for the 1.6 $\mu$m thick sacrificial oxide. The 10.3 $\mu$m thick Structural ISDP (In-Situ Doped Polysilicon) layer is deposited as a 11.8 $\mu$m thick layer at a rate of 3.5 $\mu$m/minute and at a temperature of 1180° C. in a ASM Epsilon One Model-E2 single wafer epitaxy reactor using a standard trichlorosilane (SiHCl3), hydrogen (H2), and phosphine (PH3) process. The resulting 11.8 $\mu$m thick Structural ISDP layer has an average surface roughness (Ra) of 260 nm, which is unacceptable for further processing.

A chemical mechanical polishing (CMP) step is then used in the Furtsch process to reduce the thickness of the Structural ISDP to 10.3 $\mu$m and its surface roughness to about 5 nm. The silicon single crystals growing epitaxially over the silicon substrate regions opened through the 2.5 $\mu$m thick Pad oxide windows have a sheet resistance of 2 k$\Omega$/sq. The as-grown polycrystalline structure being higher than 100 M$\Omega$/sq., a 900° C. POCl3 doping is also performed, resulting in the growth of a 30 nm thick phosphorous glass (PSG) on top of the Structural ISDP. This thin grown PSG layer is removed using a standard HF etching solution. A protective oxide is grown at 900° C. to prevent the out-diffusion of phosphorus during the following 7 hours duration 1000° C. P-dopant drive-in in a nitrogen ambient. The protective oxide is then removed.

The Deep silicon etch patterns are generated using the technique described in the paper by M. Offenberg, F. Larmer, B, Elsner, H. Munzel and W. Riethmuller, 'Novel process for a monolithic integrated accelerometer', Digest of technical papers: Transducers '95—Eurosensors IX, Vol. 1, pp. 589–592, Stockholm, 1995.

The release of the Structural ISDP components is done using an HF vapor technique described in the paper by M. Offenberg, B, Elsner and F. Larmer, 'HF vapor etching for sacrificial oxide removal in surface micromachining', Extended Abstracts Electrochem. Soc. Fall Meeting, Vol. 94–2, pp. 1056–1057, Miami Beach, 1994.

No further details are given about the 1.3 $\mu$m thick metal layer, about the 380 $\mu$m thick Cap wafer or about the 75 $\mu$m Cavity. The resulting is a released MEMS device ready to be bonded to a protective Cap wafer, as shown in FIG. 6. Robert Bosch GmbH currently uses glass frit to bond this protective Cap wafer to the substrate as to provide an hermetic seal.

FIG. 7 summarizes the release of the Structural ISDP forming the moving components of the MEMS-based microsensors or micro-actuators as performed at Robert Bosch GmbH and as described in the above three references. The steps are as follows:

a. Selection of 150 mm (100) N-type 1–2 $\Omega$.cm resistivity silicon wafer;

b. Thermal growth of 2.5 $\mu$m of Pad oxide, followed by patterning;

c. 630° C. LPCVD of 0.45 $\mu$m of Surface polysilicon, followed by an antimony implant, by a 1000° C. O2 anneal, and by patterning;

d. Deposition of 1.6 $\mu$m of Sacrificial oxide;

e. Deposition of 11.8 $\mu$m of Structural ISDP at a rate of 3.5 $\mu$m/minute and at a temperature of 1180° C. in a ASM Epsilon One Model-E2 using SiHCl3, H2 & PH3 gases, followed by a CMP of 1.5 $\mu$m to reduce the thickness of the Structural ISDP to 10.3 $\mu$m, followed by a 900° C. POCl3 doping, followed by the removal of the grown 30 nm thick PSG with HF solution, followed by the growth, at 900° C., of a protection oxide, followed by a 7 hours duration P-dopant drive-in in N2 at a temperature of 1000° C. and, finally, followed by the removal of the protection oxide;

f. Deposition and patterning of a 1.3 $\mu$m metal layer;

g. Deep silicon etch of the Structural ISDP using the technique described in the following reference M. Offenberg, F. Larmer, B, Elsner, H. Munzel and W. Riethmuller, 'Novel process for a monolithic integrated accelerometer', Digest of technical papers: Transducers '95—Eurosensors IX, Vol. 1, pp. 589–592, Stockholm, 1995; and h. Release of Structural ISDP components with HF vapor using the technique described in the paper by M. Offenberg, B, Elsner and F. Larmer, 'HF vapor etching for sacrificial oxide removal in surface micromachining', Extended Abstracts Electrochem. Soc. Fall Meeting, Vol. 94–2, pp. 1056–1057, Miami Beach, 1994.

Additional details of this surface micromachining process are also available in the reference http://www.imec.be/SUMICAP/Welcome.html#who.

The SUMICAP (SUrface Micromachined enCAPsulation on wafer-level) project carried out by IMEC, Bosch and STS within the framework of the Information Societies Technology (IST) program of the European Commission (contract number IST-1999-10620) between January 2000 and December 2002 is intended to develop a wafer-level encapsulation technique for MEMS using surface micromachined membranes over a device that needs to be encapsulated in a vacuum (below 100 Pa) or controlled atmosphere. This monolithic wafer-level packaging technique should be capable of covering 1 mm by 1 mm MEMS devices having high aspect ratio trenches (1:5); survive standard plastic molding; use less chip area and material than the current capping process; provide a 50% reduction of the total chip cost; and a vacuum in the cavity below 100 Pa.

The project managed by IMEC uses the following steps: sacrificial oxide layer deposition, membrane layer deposition, sacrificial oxide etching using the standard STS equipment, sealing layer deposition and Interconnections. The expected result is a wafer-level surface micromachined encapsulation in a plastic molding of an accelerometer demonstrator optimized using Bosch's extensive simulations to determine the required thickness and stress of the membrane and sealing layer, the number of supports and the optimal sensor design.

A review of prior art indicates that there is a need to improve the packaging techniques of MEMS devices to ensure higher yields, higher performance and improved reliability. Most of the cited prior art describes the need for bonding multiple substrates to get the required protective cavity around the moving and/or particular component of the MEMS device, in particular U.S. Pat. No. 5,668,033; U.S. Pat. No. 5,783,749; U.S. Pat. No. 5,952,572; U.S. Pat. No. 6,140,144; U.S. Pat. No. 6,232,150; U.S. Pat. No. 6,265,246; U.S. Pat. No. 6,297,072; U.S. Pat No. 6,335,224; the paper by B. Lee, S. Seok, J. Kim, and K. Chun, 'A mixed micromachined differential resonant accelerometer', Work supported by ADD (Agency for Defense Development) through ACRC (Automatic Control Research Center) under Grant AC-041 and by the Brain Korea21 Project; the paper by B. Lee, C. Oh, S. Lee, Y. Oh and K. Chun, 'A vacuum packaged differential resonant accelerometer using gap sensitive electrostatic stiffness change effect', Work supported by ADD (Agency for Defense Development) through ACRC (Automatic Control Research Center) under Grant AC-041; and the paper by Gianchandani, H. Kim, M. Chinn, B. Ha, B. Lee, K. Najafi and C. Song, 'A fabrication process for integrating polysilicon microstructures with post-processed CMOS circuitry', J. Micromech. Microeng. Vol 10 (2000), pp. 380–386.;

One of the cited references reviews the effect of the residual vacuum on the undesirable reduction of the Q factor of RF switches operating at very high frequencies as described in G.M. Rebeiz and J.B. Muldavin, 'RF MEMS switches and switch circuits', IEEE Microwave Magazine, December 2001, pp. 59–64; U.S. Pat. No. 5,937,275; the reference at http://www.europractice.bosch.com/en/download/customer support.pdf as shown in FIGS. 5, 6 and 7, and the paper by M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin Tex., Sep. 29–30, 1997 (FIG. 5). In FIG. 5, S1 represents the wafer thickness of 675±15 $\mu$m; S2 represents the pad oxide layer thickness of 2.5±0.15 $\mu$m; S3 the represents the surface polysilicon layer thickness of 0.45±0.05 $\mu$m; S4 represents the sacrificial oxide layer thickness of 1.6±0.2 $\mu$m, S5 represents the structural ISDP layer thickness of 10.3±1.0 $\mu$m; S6 represents the metal layer thickness of 1.3±0.2 $\mu$m; S7 represents the cap wafer thickness of 380±15 $\mu$m; and S8 represents the cavity height of 75±25 $\mu$m.

It is known that Direct Wafer Bonding (DWB) of two substrates is not a suitable technique for vacuum packaged MEMS because of its required very high 1000° C. bonding temperature. The Glass Frit Bonding technique discussed in some of the afore-mentioned Bosch Prior Art references is also unsatisfactory because its associated poor vacuum level degrades the Q-factor of most gyroscopes, accelerometers, RF switches and many other MEMS-based devices requiring packaging under a vacuum typically better than 1 Pa. This explains Samsung's upper discussed Anodic Bonding. This technique still requires bonding of multiple substrates at temperatures of about 500° C. at which the mobility of the positive ions (typically Na+) and the reactivity of the glass-silicon interface cause oxygen from the glass to be transported under the existing electric field and cause its combination with the interfacial silicon as to form a permanent $SiO_2$ bond.

Unfortunately, the increased demand for higher yield and lower cost processes for the production of CMOS integrated MEMS devices in cost-sensitive markets, such as automotive and consumer electronics, requires the replacement of anodic bonding or other multiple substrates bonding techniques by a lower cost, single substrate, CMOS compatible wafer-level encapsulation technique. The above-described IMEC-Bosch-STS SUMICAP project on-going within the IST program of the European Commission (http://www.imec.be/SUMICAP/Welcome.html#who) is intended to develop such a wafer-level encapsulation technique for MEMS in standard plastic moldings using surface micromachined membranes with a 100 goal which is will still very restrictive for the high performance (high Q-factor) micro-gyros, micro-accelerometers, differential resonant accelerometers and other MEMS-based devices requiring a residual vacuum level better than 1 Pa. Unfortunately, little is really known about this program.

SUMMARY OF THE INVENTION

According to the present invention there is provided a method of fabricating a microstructure with a vacuum-sealed cavity, comprising the steps of fabricating said cavity in an encapsulation structure under a vacuum in a vacuum chamber; sealing said cavity with a capping layer; and depositing a stiff high Young's modulus protective layer under tensile stress on said capping layer prior to venting said vacuum chamber to atmospheric pressure.

The present invention addresses the fact that sealing aluminum or aluminum alloy experiences a high tensile stress following venting of the vacuum cavity to atmospheric pressure.

A material with a high Young's modulus has sufficient stiffness to support the capping layer during subsequent venting to the atmosphere. The Young's modulus should be above about 80, and preferably above about 300.

Since aluminum or aluminum alloys under tensile stress are known to be prone to stress-induced voiding resulting in micro-voids generation and in micro-crack propagation, a second rigid protective upper-sealing layer is added over the sealing aluminum layer as to prevent seal breakage. This upper-layer is preferably deposited in-situ the aluminum alloy deposition equipment at a relatively low temperature compatible with the underlying aluminum or aluminum alloy after aluminum or aluminum alloy deposition and before venting to atmospheric pressure as to prevent the upper-mentioned stress-induced voiding and seal breakage effects.

This upper-layer is under tensile stress to prevent buckling of the resulting structure and is preferably selected from the following list of high Young's modulus and high yield strength preferred materials: Titanium nitride, TiN; Titanium aluminonitride, TiAlN; Molybdenum silicide, $MoSi_2$; Titanium carbide, TiC; Silicon carbide, SiC; Tungsten, W; Aluminum nitride, AlN; Titanium aluminide, TiAl; Molybdenum, Mo; Tantalum, Ta; Platinum, Pt; Tungsten silicide, $WSi_2$; Titanium, Ti; Gold, Au; Any other material deposited in-situ the aluminum or aluminum alloy deposition equipment after aluminum or aluminum alloy deposition at a relatively low temperature compatible with the underlying aluminum or aluminum alloy and before venting to atmospheric pressure.

The cavity may contain moving or other components sealed under a vacuum of less than 1 Pa.

The present application relates to the use of an in-situ deposition of a tensile stress high Young's modulus material or combinations of materials after the deposition of the sealing aluminum alloy and before exposure to atmospheric pressure to achieve a reliable single-substrate wafer-level vacuum package capable of maintaining a vacuum-sealed cavity under vacuum condition around the moving and/or particular component of MEMS device. This vacuum environment can protect the moving or other component of a MEMS device against micro-contamination from the particles and slurry of the wafer dicing process, and against fluctuations of atmospheric conditions such as atmospheric pressure and relative humidity so as to ensure a long-term reliability for the moving or other component.

The invention also provides a microstructure having a vacuum-sealed cavity, comprising an encapsulation structure defining a cavity; a capping layer sealingly closing said cavity; and a stiff high Young's modulus protective layer under tensile stress deposited on said capping layer prior.

BRIEF DESCRIPTION OF THE DRAWINGS

The invention will now be described in more detail, by way of example only, with reference to the accompanying drawings, in which:

FIG. 1 shows a MEMS based resonant accelerometer fabricated using double CMP and double anodic bonding technology (Samsung Corporation);

FIG. 2 shows the effect of residual vacuum on the performance of a vacuum-sealed MEMS based resonant accelerometer fabricated by the anodic bonding of two substrates (Samsung Corporation);

FIG. 4 shows RF switches from Broadside and Raytheon Broadside MEMS-series switches with a) One electrode; b) Two electrodes; c) InlineMEMS-series switches, and Raytheon MEMS capacitive shunt switch in d) Cross-section view; e) Electrical CLR model.

FIG. 9 shows a conformal coating layer of polysilicon and LPCVD silicon nitride;

FIG. 15 shows the mechanical properties of the preferred upper sealing and stiffening layers which could be deposited in-situ the vacuum deposition equipment over the aluminum or aluminum alloy (Ranked in descending order of Young's modulus);

FIG. 16 shows the mechanical properties of typical structural materials used in the fabrication of MEMS devices; (Ranked in descending order of Young's modulus)

DETAILED DESCRIPTION OF THE PREFERRED EMBODIMENTS

Figure 3:
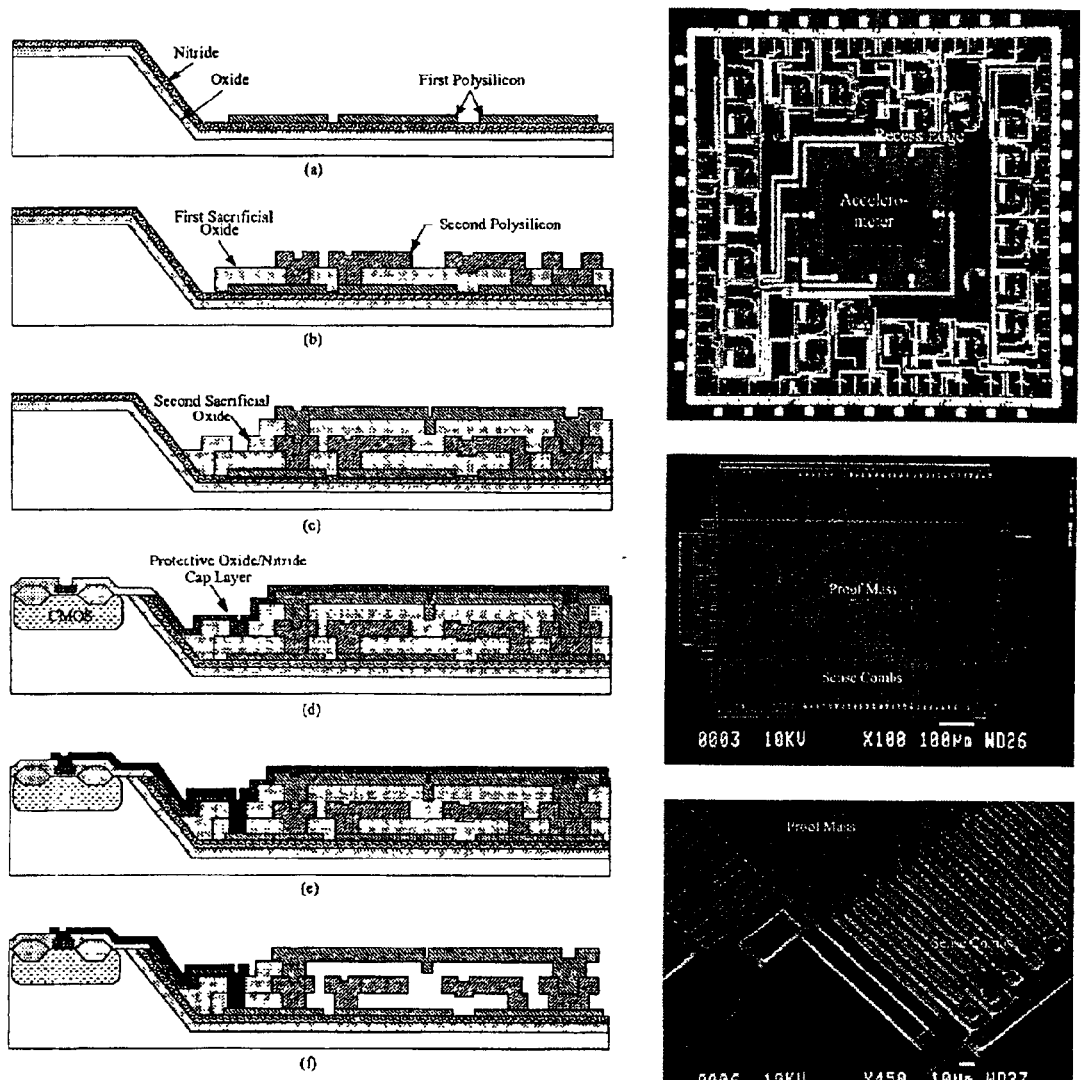
FIG. 3 shows the integration of a MEMS protective third polysilicon layer in a CMOS integrated MEMS based accelerometer (Samsung Corporation)
Figure 5:
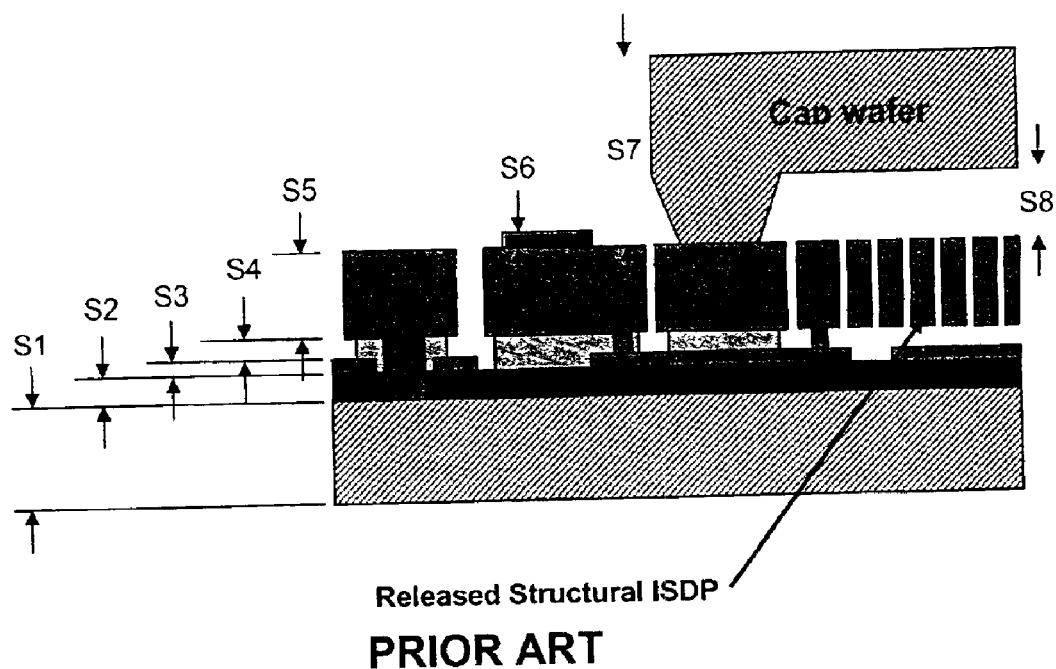
FIG. 5 shows a Robert Bosch surface micromachining profile described at (http://www.europractice.bosch.com/en/foundry/)
Figure 6:
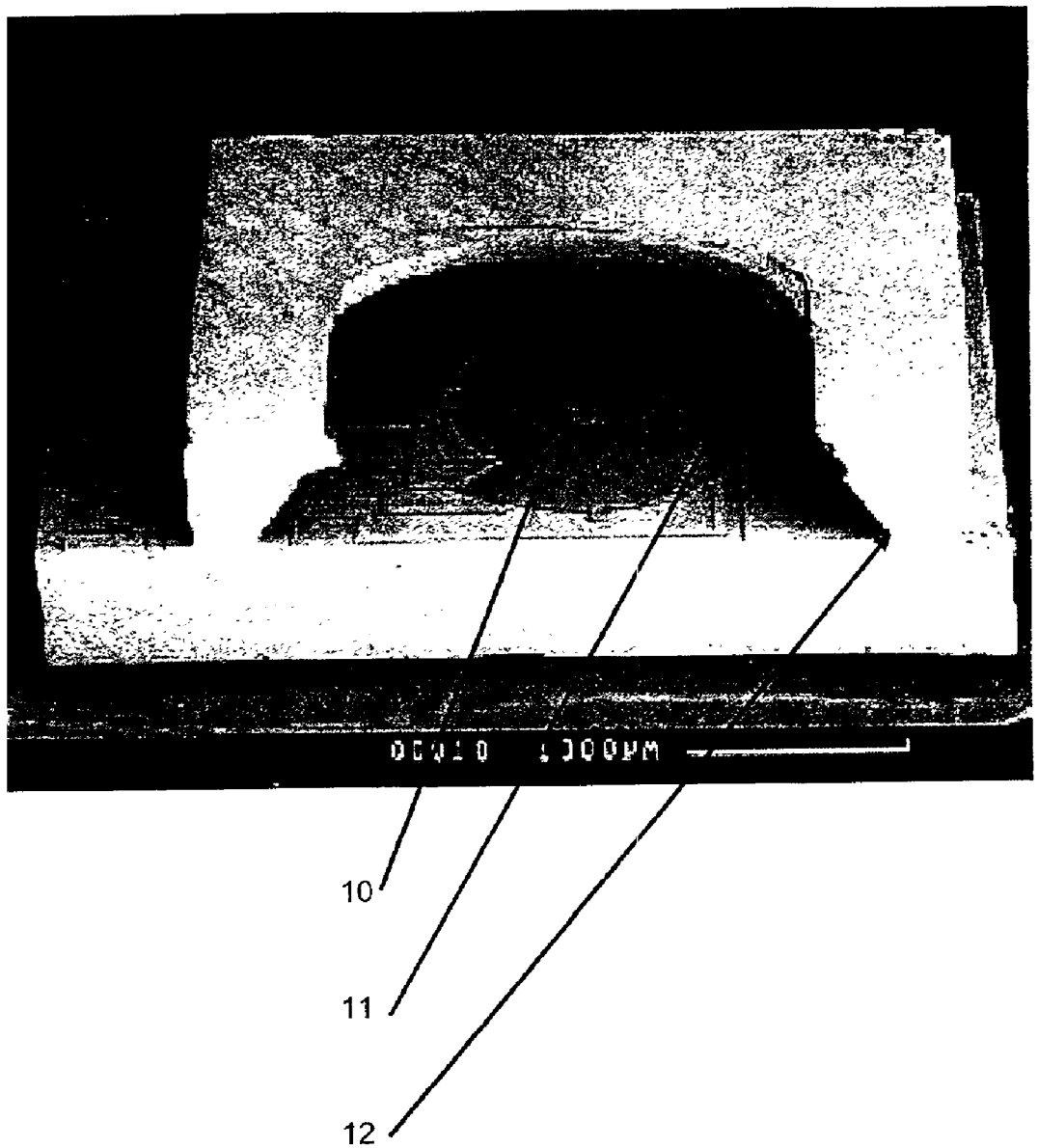
FIG. 6 shows a cap wafer glass frit bonded to the surface micromachined gyroscope produced at Robert Bosch GmbH. (http://www.imec.be/SUMICAP/Welcome.html)
Figure 7:
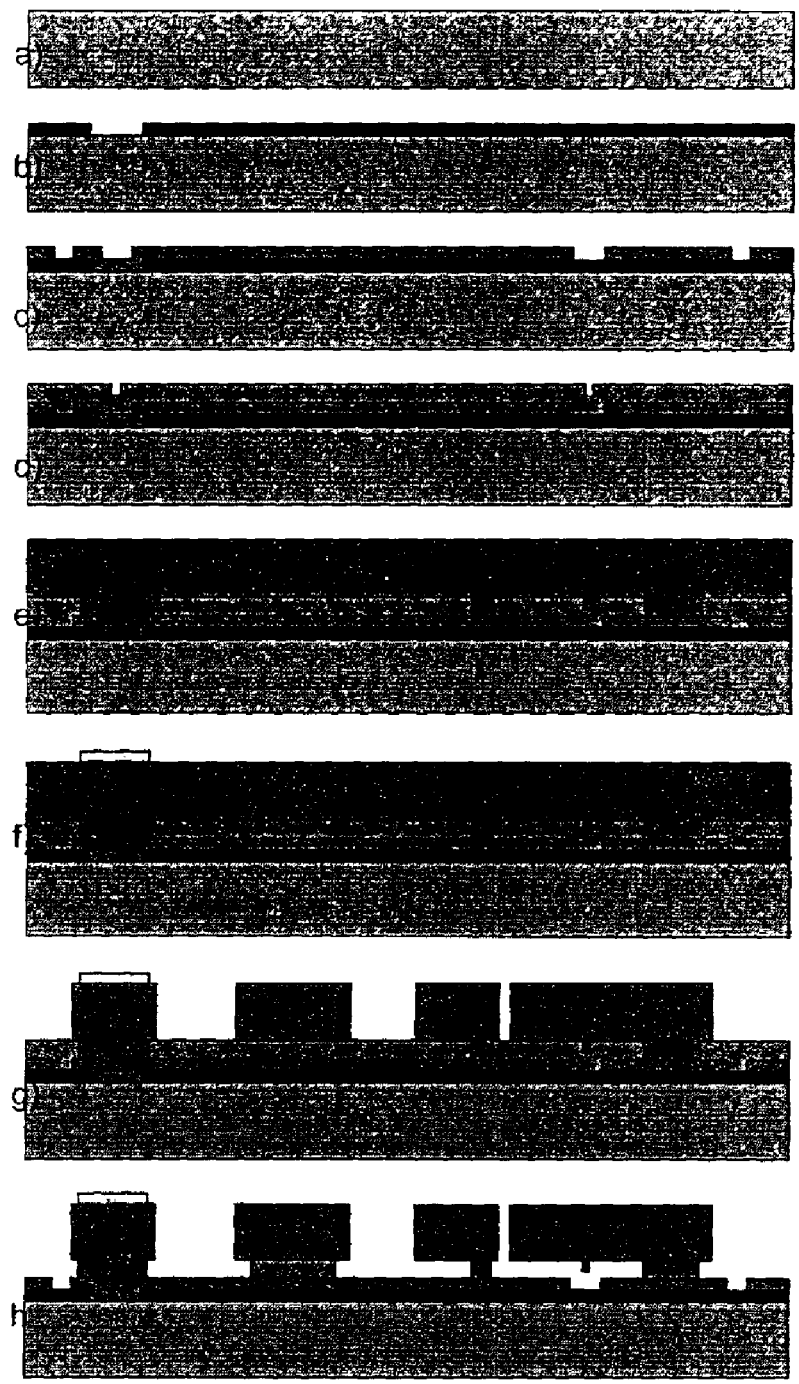
FIG. 7 shows a typical surface micromachining process flow up to the release of the structural polysilicon components.
Figure 8:
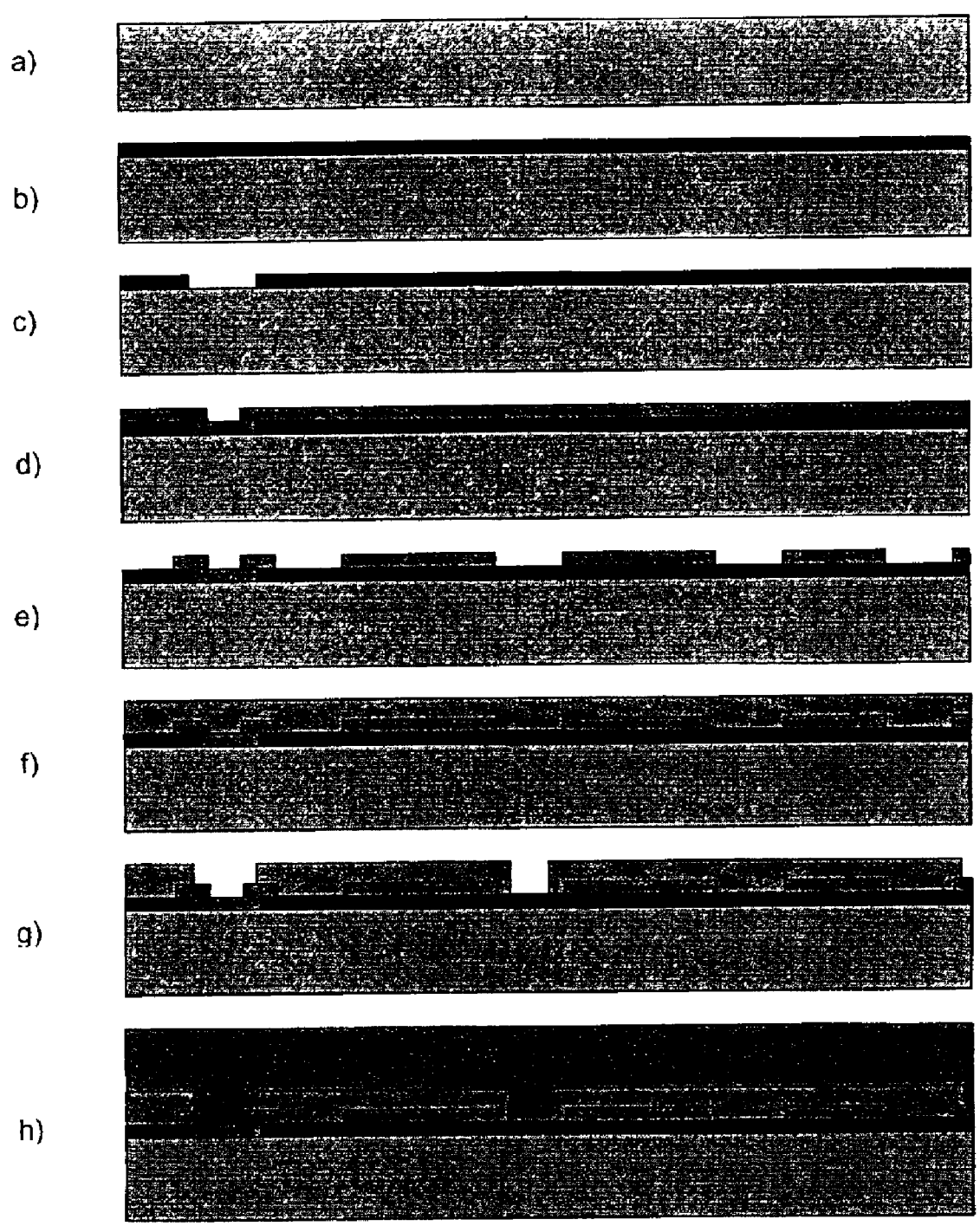
FIG. 8 shows an integrated process for a single-substrate, wafer-level protective cap.
Figure 8:
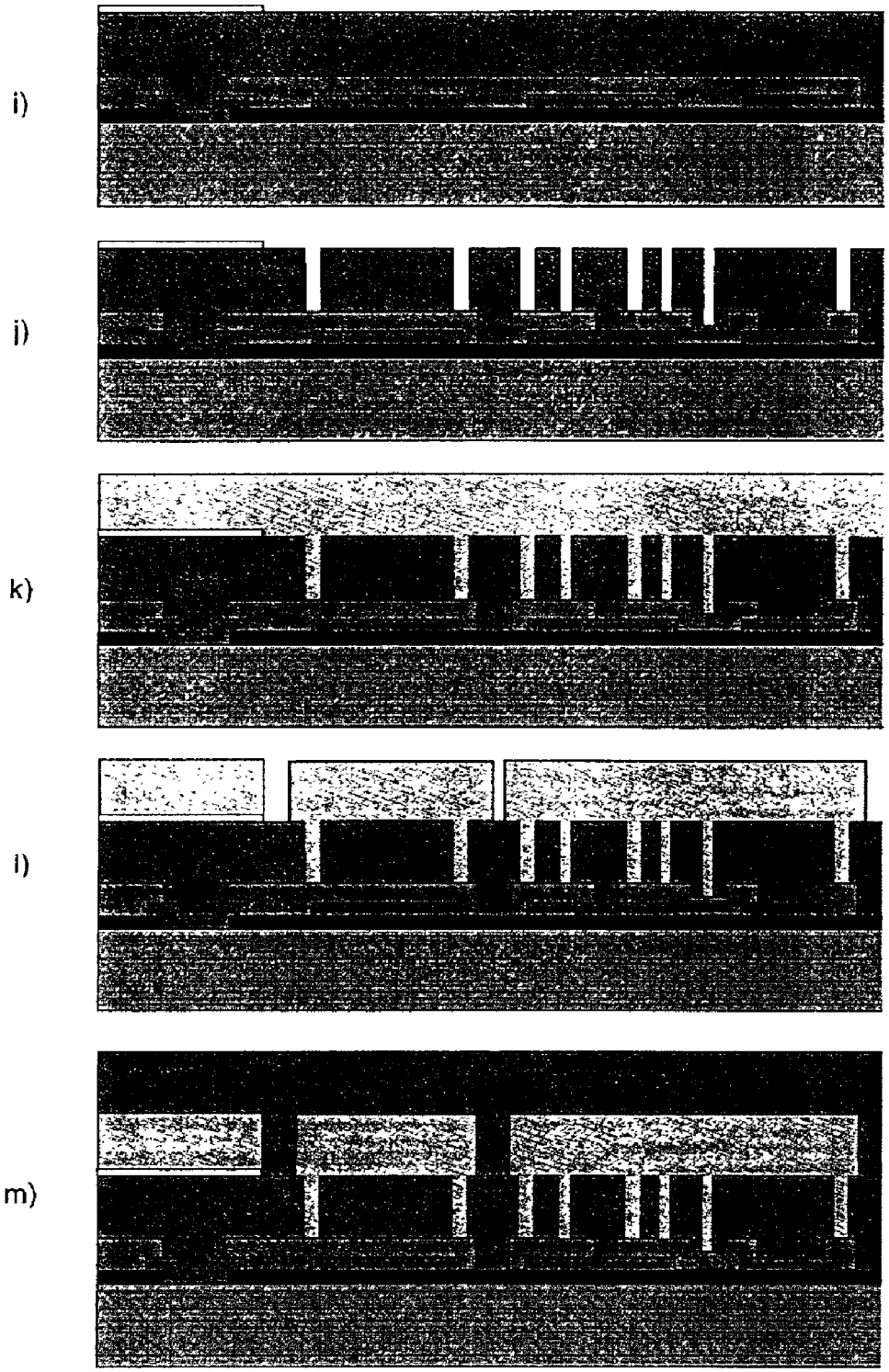
Figure 8:
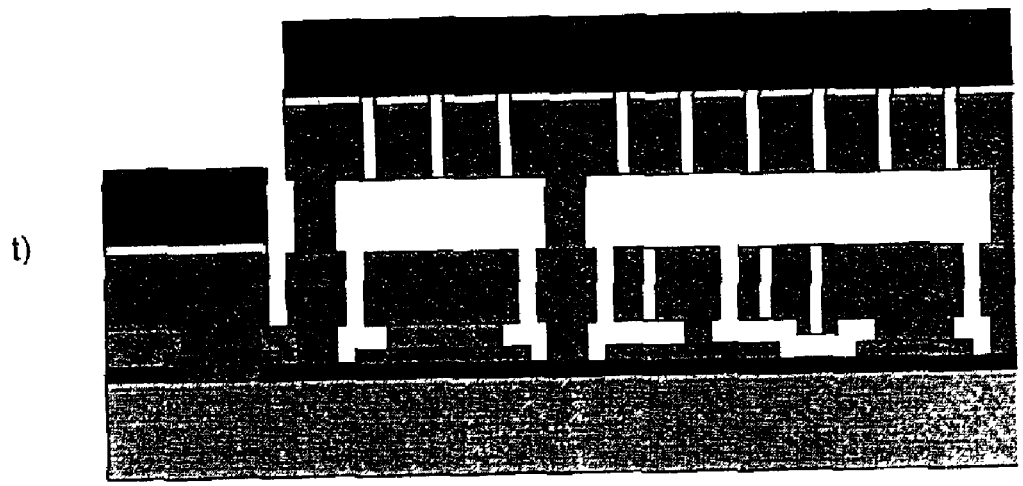

Reference will now be made to FIG. 8, which shows at steps (a) to (t), an integrated process for forming for a single-substrate, wafer-level protective cap as described in our co-pending U.S. patent application Ser. No. 10/120,528, filed Apr. 12, 2002, entitled 'Wafer-level MEMS packaging', the contents of which are herein incorporated by reference. In FIG. 8:

step a) shows the silicon substrate;

step b) shows the pad oxide growth;

step c) shows the pad oxide patterning;

step d) shows the surface polysilicon deposition;

step e) shows the surface polysilicon patterning;

step f) shows the deposition of the lower sacrificial material;

step g) shows the patterning of the lower sacrificial material;

step h) shows the structural isdp deposition and post-deposition doping;

step i) shows the deposition and patterning of titanium nitride;

step j) shows the photolithography and deep-etch of the Structural ISDP;

step k) shows the deposition of an upper sacrificial material made of a conformal (to fill the closely packed etched patterns and structures) Tetra-Ethyl-Ortho-Silicate glass, TEOS, of a silica glass, SiO2, of a phosphosilicate, PSG, or of another silicate glass, such as the ones obtained from boron, titanium or germanium incorporation; having a low mechanical stress as to avoid disrupting the deep etched Structural ISDP structures still bonded to the Lower sacrificial material; and deposited at low temperature (lower than 500° C.) as to obtain a material prone to a very high etch rate when exposed to HF Vapor;

step l) shows the patterning of the uUpper sacrificial material to create a series of pillars and localized structures to be filled with the encapsulation structure to enhance the mechanical rigidity and prevent the collapse of the encapsulation structure when exposed to atmospheric pressure. The patterning of the upper sacrificial material also defines the outer limits of the cavity under construction;

step m) shows the deposition of the encapsulation structure at a thickness of the order to 10 μm but optimized by its constituent material; using the following preferred materials: titanium, Ti, titanium nitride, TiN, polysilicon, poly-Si, silicon nitride, SiN, tungsten, W, titanium tungsten alloy, Ti—W, or combinations of these; having a very high Young's Modulus, in excess of 100 GPa, as to prevent excessive deformation following the atmospheric pressure of the underlying sealed cavity; having a very high resistance to HF vapor, as to allow the removal of the Upper sacrificial material and of the Lower sacrificial material without any substantial widening of small diameter etch pipes to be machined in the encapsulation structure; deposited at an as low temperature as possible, as to limit as much as possible the densification of Upper sacrificial material thus ensuring a much faster etch rate in HF vapor; and having an excellent conformal deposition to generate the vertical pillars and localized vertical structures required to enhance the mechanical stability of the encapsulation structure and prevent its collapse during exposure to atmospheric pressure of the vacuum sealed cavity;

step n) shows the patterning of the encapsulation structure to produce a matrix of small diameter deep etch pipes which will later allow the very rapid removal of the Upper sacrificial material and the slower removal of the Lower sacrificial material using HV vapor, thus forming released MEMS components inside an enclosed cavity, ready to be sealed;

step o) shows the removal of the Upper sacrificial material located in the upper cavity as well as outside the cavity, over the Titanium nitride and of the Lower sacrificial material using HF vapor. At this process stage the MEMS structures are free to move since they are released from their surrounding material;

step p) shows the optional deposition of a titanium based layer to be used as an in-situ getter of hydrogen, oxygen or water vapor, thus enhancing the lifetime of the device by gettering these undesirable gases;

step q) shows the deposition, under a vacuum better than 1 Pa, of a thick layer of an aluminum alloy followed by an in-situ high temperature self-diffusion provoking the bridging and vacuum sealing of the upper etch pipes of the encapsulation structure. It also shows that to this aluminum alloy can be combined other layers which enhance the rigidity of the structure as to prevent its implosion following the exposure of the vacuum-sealed metal coated wafer to atmospheric pressure;

step r) shows the patterning of the aluminum interconnects and bond pads outside the cavity, over the Titanium nitride layer;

step s) shows the removal of the Titanium nitride surrounding the aluminum interconnects and the bond pads outside the cavity; and step t) shows the completed device following the removal of the Structural ISDP surrounding the aluminum interconnects and bond pads outside the vacuum-sealed protection cavity.

The effect of the encapsulation structure thickness on the downward vertical movement of its center point during atmospheric pressure exposure will now be considered.

The underlying encapsulation structure is preferably selected from these preferred materials: titanium, titanium nitride, polysilicon, silicon nitride, tungsten, titanium tungsten, or combinations of these; and is a conformally deposited material capable of producing the required vertical pillars and localized vertical structures required to enhance the mechanical stability of the encapsulation structure and prevent its collapse during exposure to atmospheric pressure of the vacuum sealed cavity.

FIG. 9 shows that polysilicon and Low Pressure Chemical Vapour Deposited (LPCVD) silicon nitride can both be deposited conformally to fill openings with no voids. CVD tungsten can also be deposited with excellent conformality. Since silicon nitride requires a higher deposition temperature of 800° C., which causes a less desirable densification of the underlying porous Upper Sacrificial Material (Steps k and l) of FIG. 8) and a slower etch rate in HF vapor (Step o) of FIG. 8), lower temperature CVD polysilicon and/or CVD tungsten are preferred materials.

The encapsulation structure is perforated with a matrix of small diameter (about 1 μm) etch pipes as to allow HF vapour to etch the upper sacrificial material and the Lower sacrificial material without any substantial widening of small diameter etch pipes as to release the moving structures (step o) of FIG. 8) while keeping intact the encapsulation structure and its pillars.

The encapsulation structure also has a very high Young's modulus, in excess of 100 GPa, to prevent excessive deformation of the sealed cavity following its exposure to atmospheric pressure.

Figure 10:
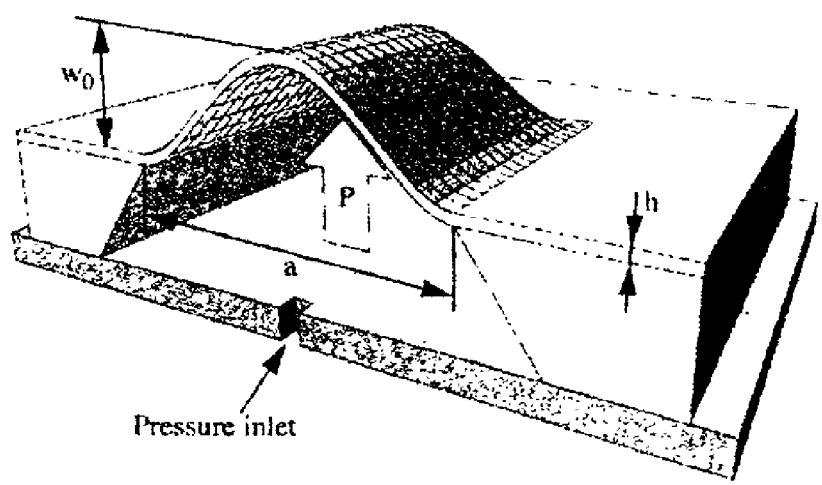
FIG. 10 is an estimate of the vertical movement of the encapsulation structure using the Bulge testing model.

Accordingly to the following two references, polysilicon has a Young's modulus of 169 GPa and a Poisson's coefficient of 0.22: W. N. Sharpe Jr., K. M. Jackson, K. J. Hemker, and Z. Xie, 'Effect of Specimen Size on Young's Modulus and Fracture Strength of Polysilicon', Journal of microelectromechanical systems, Vol. 10, No. 3, September 2001; and Biomedical Microdevices 2:4, 2000, p.295–303;

Knowing these characteristics, the Bulge test model of FIG. 10 taken from V. Ziebart, 'Mechanical Properties of CMOS thin films', A thesis submitted to the Swiss Federal Institute of Technology, Zurich, Published by: Physical Electronics Laboratory, Swiss Federal Institute of Technology (ETH) Zurich, 1999, 144 pages, ISBN 3-89649-519-4, can be used to estimate the atmospheric pressure deformation of a polysilicon encapsulation structure fabricated with a 300 MPa tensile (as to prevent buckling) mechanical stress polysilicon located over a 750 $\mu$m×750 $\mu$m vacuum cavity.

Figure 11:
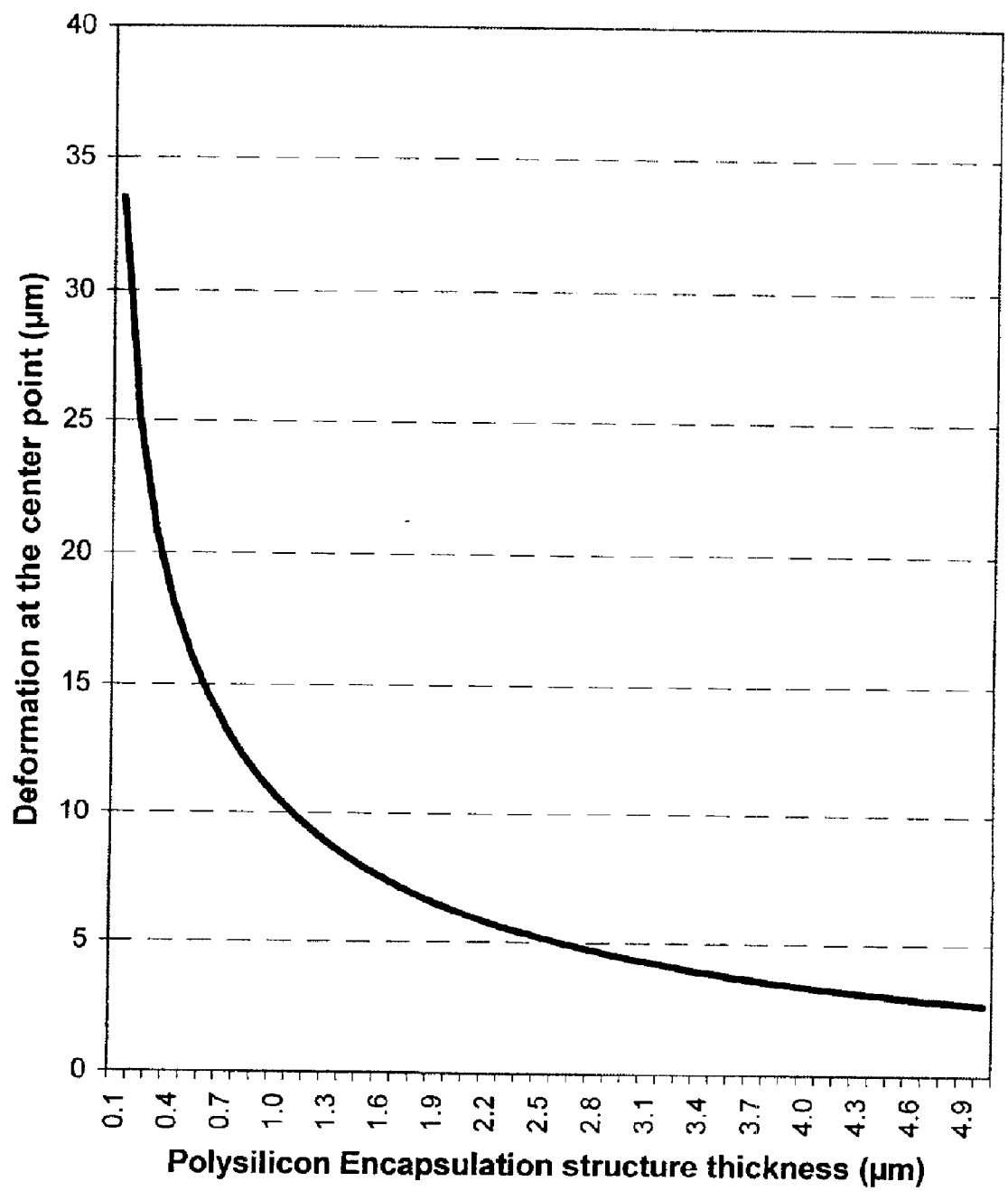
FIG. 11 shows the downward vertical movement of a polysilicon only encapsulation structure located over a 750 $\mu m \times 750 \mu m$ vacuum cavity following its atmospheric pressure exposure.

FIG. 11 shows the simulation results of such downward vertical movement of the center point of this vacuum cavity following its exposure to atmospheric pressure as a function of the polysilicon thickness. FIG. 11 shows that the center point of a 5 $\mu$m thick polysilicon encapsulation structure will experience a spontaneous 2.5 $\mu$m vertical downward displacement during exposure to atmospheric pressure. Clearance for such movement will then be assumed in a properly designed device.

The effect of the lateral size of a square vacuum cavity on the downward vertical movement of the center point of a 5.0 $\mu$m thick encapsulation structure during atmospheric pressure exposure will now be considered. Assuming a 5.0 $\mu$m thick polysilicon encapsulation structure, having a Young's modulus of 169 GPa and a Poisson's coefficient of 0.22, the Bulge test model of FIG. 10 can again be used to estimate the atmospheric pressure deformation of the 5.0 $\mu$m thick polysilicon encapsulation structure fabricated with a 300 MPa tensile (as to prevent buckling) mechanical stress polysilicon located over a variable size square vacuum cavity.

Figure 12:
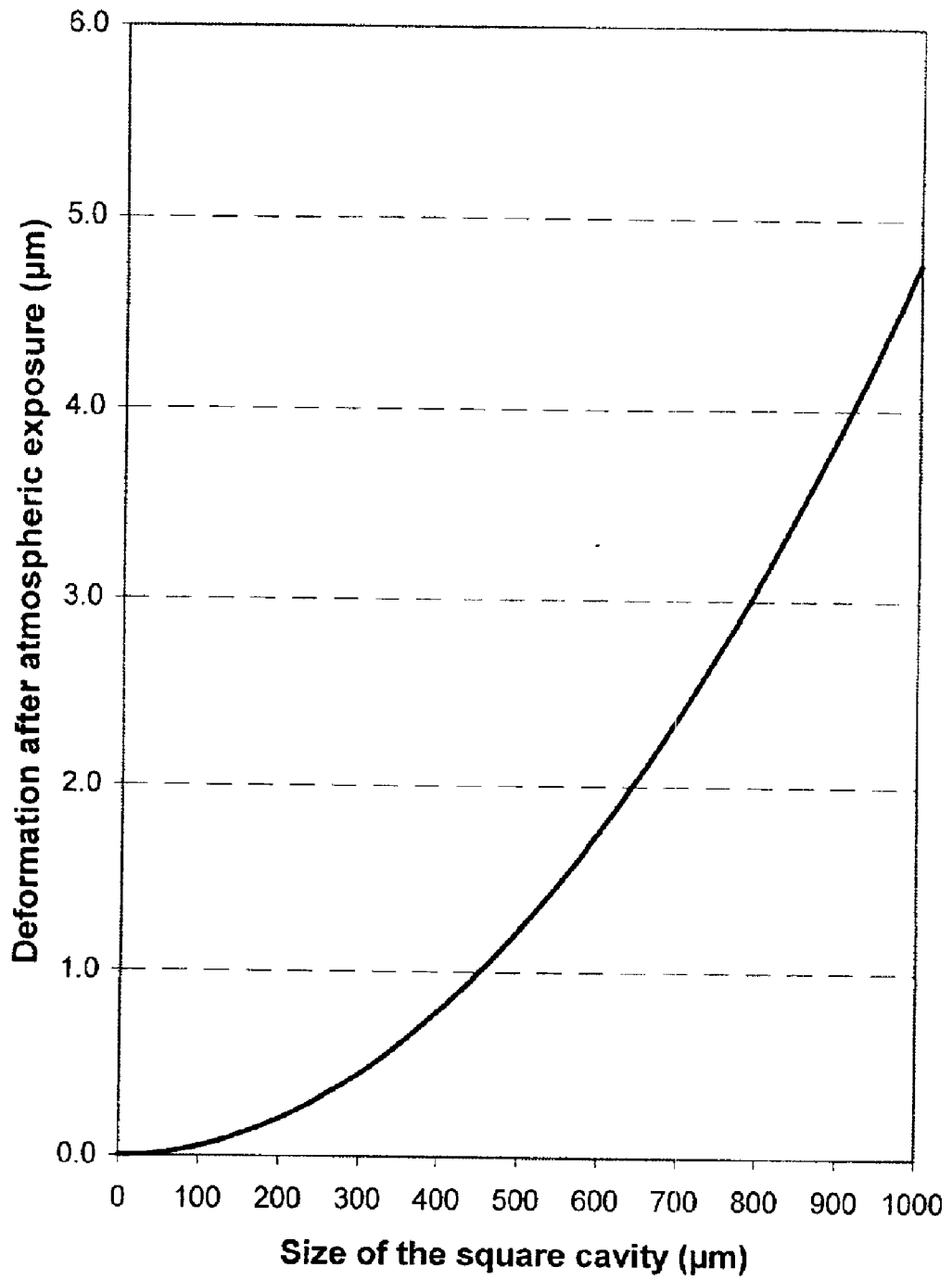
FIG. 12 shows the downward vertical movement of a 5.0 $\mu m$ thick polysilicon only encapsulation structure located over a variable size vacuum cavity following its atmospheric pressure exposure.

FIG. 12 shows the simulation results of such downward vertical movement of the center point of this 5.0 $\mu$m thick polysilicon encapsulation structure as a function of the variable size vacuum cavity following its exposure to atmospheric pressure. It is shown that the center point of a 5.0 $\mu$m thick polysilicon encapsulation structure will experience a spontaneous 4.8 $\mu$m vertical downward displacement during exposure to atmospheric pressure of a 1 mm×1 mm vacuum cavity. Again, clearance for such movement will then be assumed in a properly designed device.

As discussed in our co-pending patent application titled 'Wafer-level MEMS packaging' referred to above, and shown at Step q) of FIG. 8, the encapsulation structure has to be sealed by a thick self-diffused aluminum or aluminum alloy as to vacuum seal the underlying cavity with the residual argon pressure used to sputter deposit the aluminum or aluminum alloy. The result is the vacuum sealing of the underlying cavity by the natural capping of each and every small diameter etch pipes machined in the underlying 5.0 $\mu$m thick polysilicon encapsulation structure.

Figure 13:
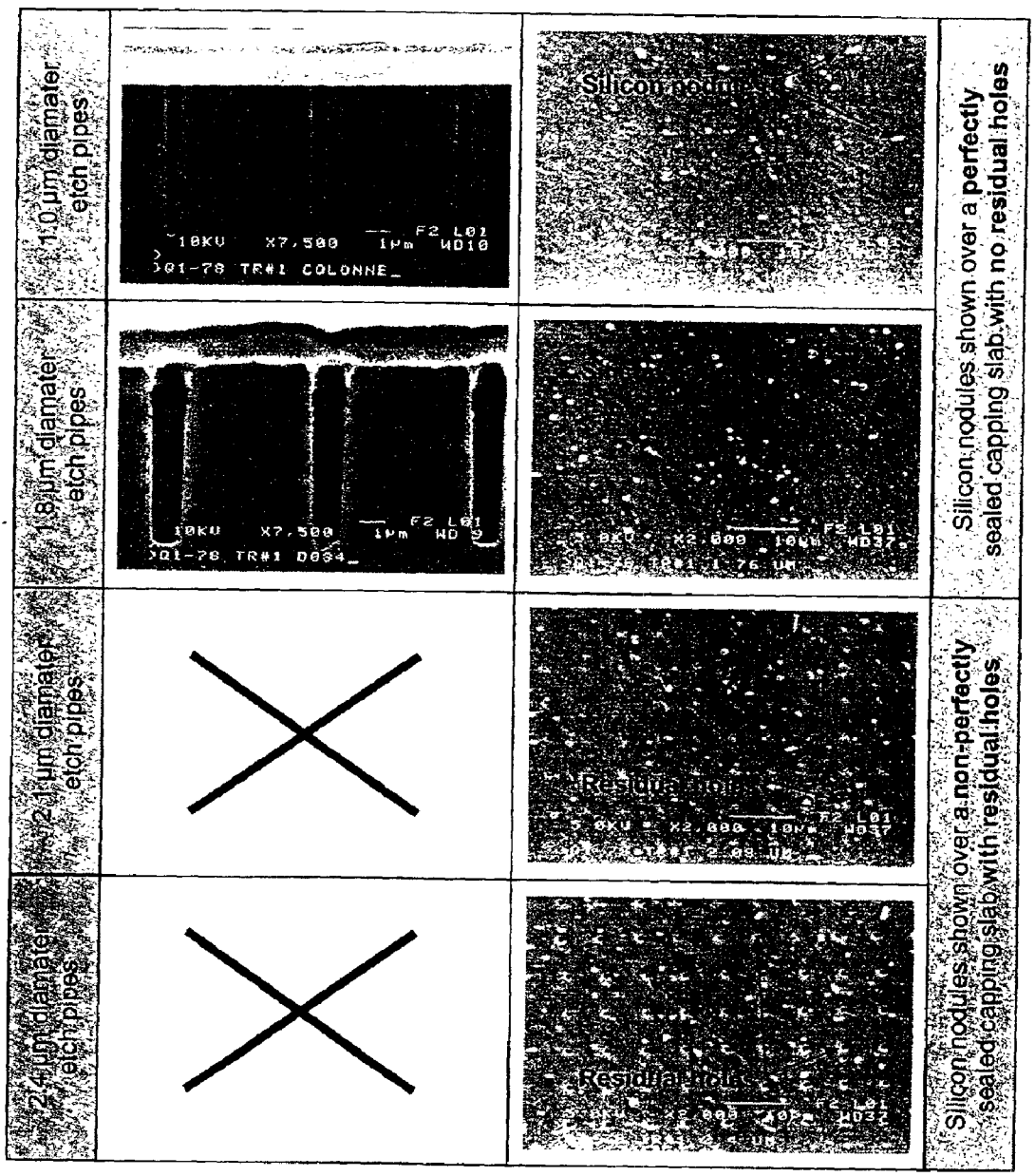
FIG. 13 is a demonstration of a sealed cap using a self-diffused aluminum alloy deposited under high vacuum conditions at a temperature of less than 500° C. to form a capping slab over small diameter etch pipes of various diameters.

FIG. 13 demonstrates such a vacuum sealing using a 0.2 $\mu$m to 20.0 $\mu$m, and preferably 2.0 $\mu$m thick self-diffused aluminum or aluminum alloy, deposited under a 0.05 Pa to 5.0 Pa and preferably about 0.5 Pa argon pressure at a temperature between 100° C. and 600° C. and preferably about 450° C. This FIG. 13 clearly shows that this self-diffused aluminum or aluminum alloy naturally cap and seal the etch pipes as to minimize its total surface area. The diameter of these etch pipes can range between 0.2 and 5.0 $\mu$m but is preferably about 1.0 $\mu$m. In fact, it is observed that the deposited aluminum or aluminum alloy deposited at on the upper sidewall region of the etch pipes simply pulls-back to form a minimum surface capping slab of aluminum or aluminum alloy and only leaves slight residues on the upper sidewalls regions of the etch pipes. FIG. 13 also shows that smaller diameter etch pipes are easier to cap than larger diameter etch pipes. In general, the preferred minimum thickness of aluminum or aluminum alloy will be about 50% more than the diameter of the etch pipes. For example, a 1.5 $\mu$m thick aluminum or aluminum alloy will be used to cap and seal 1.0 $\mu$m diameter etch pipes.

Figure 14:
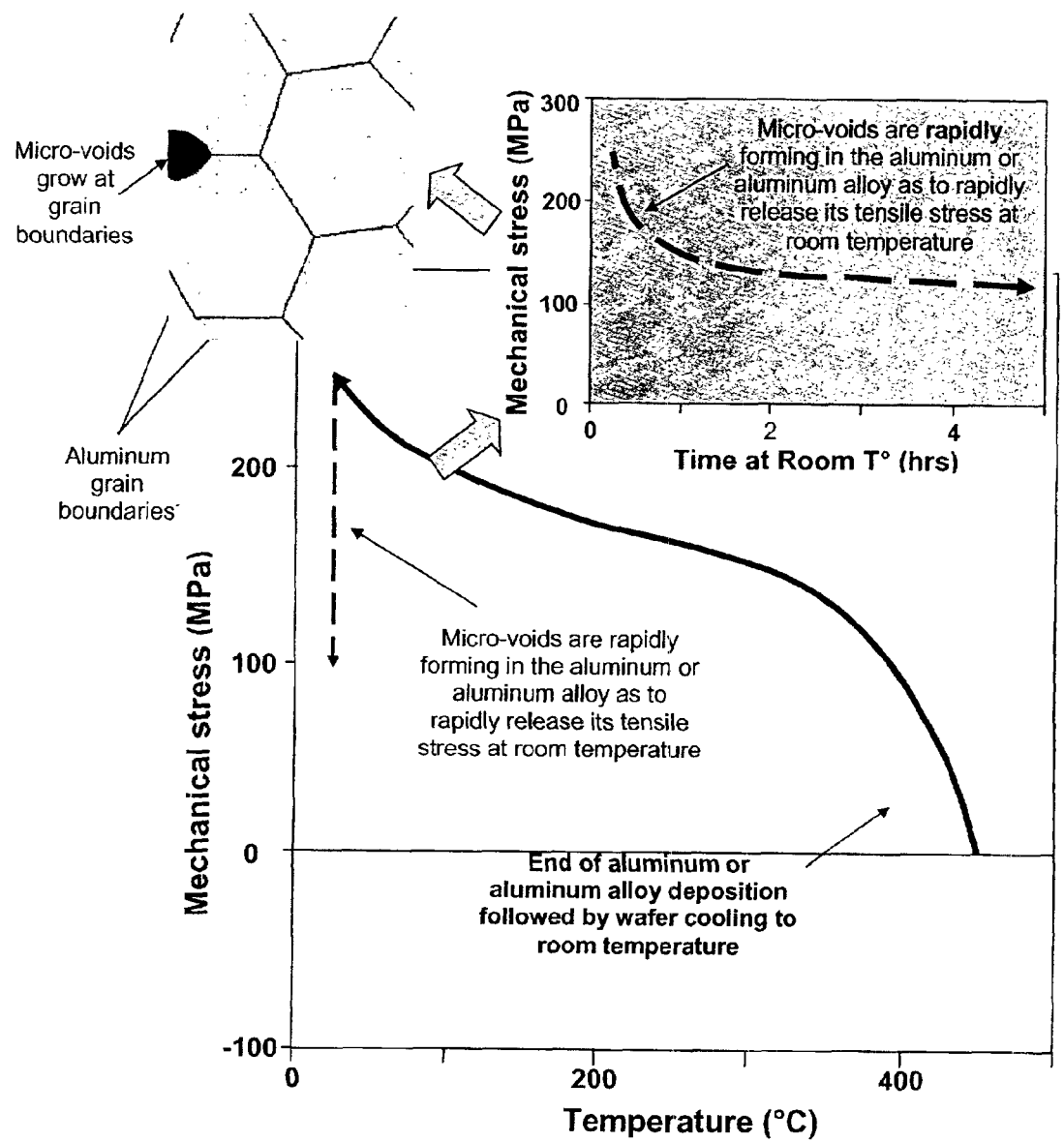
FIG. 14 shows the rapid formation of micro-voids in the aluminum or aluminum alloy resulting from the rapid release of its tensile mechanical stress at room temperature.

It is known that a hot sputtered aluminum or aluminum alloy will experience a stress voiding mechanism when returned to room temperature. This stress release can be clearly observed by the monitoring of the mechanical stress behaviour of the aluminum or aluminum alloy upon cooling and at room temperature over time. This behaviour is shown by FIG. 14.

The release mechanism of the tensile stress is an activity at the aluminum grain boundaries resulting in pinholes formation at grain boundaries and growth followed resulting in grain separation. This mechanism is very rapid and occurs in the first few minutes following the return of the metal to room temperature.

It is apparent that the stress-voiding of the aluminum or aluminum alloy will result in the loss of the vacuum seal. An upper-sealing layer less prone to stress voiding is then required as to prevent this vacuum seal breakage.

To prevent seal breakage, the upper-layer is preferably deposited in-situ the aluminum alloy vacuum deposition equipment at a relatively low temperature compatible with the underlying aluminum or aluminum alloy and before venting to atmospheric pressure.

In order to prevent stress-induced voiding the upper sealing and stiffening layer itself it should be stiffer and more resistant under tensile stress:

The stiffness of the required material to be deposited can be evaluated by its Young's Modulus (also known as the Elasticity Modulus, E) which is the ratio of the stress versus the strain within the Elastic region of the Stress-Strain diagram, or the slope of the stress vs. strain curve. Since a stiffer upper sealing layer is preferred, a higher Young's Modulus will also be preferred;

The resistance of the required material to be deposited can be evaluated by its tensile yield strength, i.e. the stress level associated to the tensile stress/tensile strain point at which the selected material behavior changes from elastic to plastic (the tensile yield point). Since a more resistant upper sealing layer is preferred, a higher tensile strength will also be preferred;

This tensile stress upper sealing and stiffening layer is preferably selected from the following list of high Young's modulus and high tensile yield strength preferred materials: Titanium nitride, TiN; Titanium aluminonitride, TiAlN; Molybdenum silicide, $MoSi_2$; Titanium carbide, TiC; Silicon carbide, SiC; Tungsten, W; Aluminum nitride, AlN; Titanium aluminide, TiAl; Molybdenum, Mo; Tantalum, Ta; Platinum, Pt; Tungsten silicide, $WSi_2$; Titanium, Ti; Gold, Au; or any other material deposited in-situ the aluminum or aluminum alloy deposition equipment after aluminum or aluminum alloy deposition at a relatively low temperature compatible with the underlying aluminum or aluminum alloy and before venting to atmospheric pressure.

FIG. 15 shows the mechanical properties of the preferred upper sealing and stiffening layer which could be deposited in-situ the vacuum deposition equipment over the aluminum or aluminum alloy. These materials are ranked in descending order of Young's modulus.

FIG. 16 allows the comparison with the mechanical properties of the typical materials which are known to be excellent structural materials used in the fabrication of MEMS devices. These materials are also ranked in descending order of Young's modulus.

Titanium nitride, TiN, is an excellent candidate for this upper sealing and stiffening layer because it can achieve an extreme Young's modulus of about 600 GPa, which is three times the one of crystalline silicon, the reference material for advanced structural MEMS devices; it can achieve an excellent tensile yield strength of about 0.97 GPa, which is 50% better than the one of silica commonly used in the various upper-mentioned vacuum packaging processes involving bonding of silica substrates; it is made of titanium and then an excellent getter material which can take care of any residual hydrogen trying to penetrate the underlying cavity; and it can easily be integrated into the aluminum or aluminum alloy vacuum deposition equipment;

One problem regarding the use of titanium nitride as the upper sealing and stiffening layer is Titanium nitride's mechanical stress. It is normally highly compressive at about −2000 to −6000 MPa. This compressive stress level prevents the use of titanium nitride because such a compressive stress level would provoke serious buckling of the resulting structure and would reduce the rigidity of the vacuum package. A titanium nitride under a tensile stress of about 300 MPa would be preferred.

Figure 17:
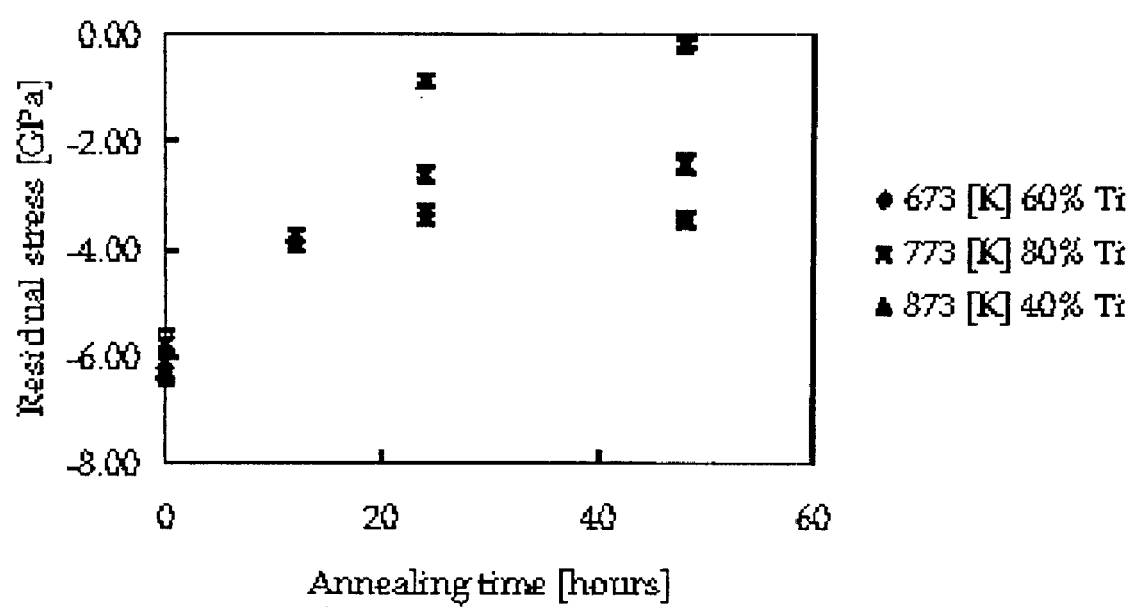
FIG. 17 shows that the compressive mechanical stress of Titanium nitride cannot be reduced by a post-deposition thermal treatment at a temperature compatible with underlying aluminum alloy (E. Zoestbergen thesis, University Library Groningen)

FIG. 17 taken from E. Zoestbergen, 'X-ray analysis of protective coatings'. Ph.D. Thesis, Faculty of Science, University Library Groningen, Dec. 15, 2000, ISBN 90 367 1327 7, Work supported by the Program for Innovative Research, surface technology under contract number IOT96006; shows that the −6000 MPa compressive mechanical stress of their Titanium nitride cannot be reduced by a post-deposition thermal treatment at a temperature compatible with the underlying aluminum or aluminum alloy. A 50-hour, 400° C. thermal treatment cannot reduce the compressive mechanical stress to less than −3500 MPa and a 50-hour, 500° C. thermal treatment cannot do better than −2500 MPa.

Figure 18:
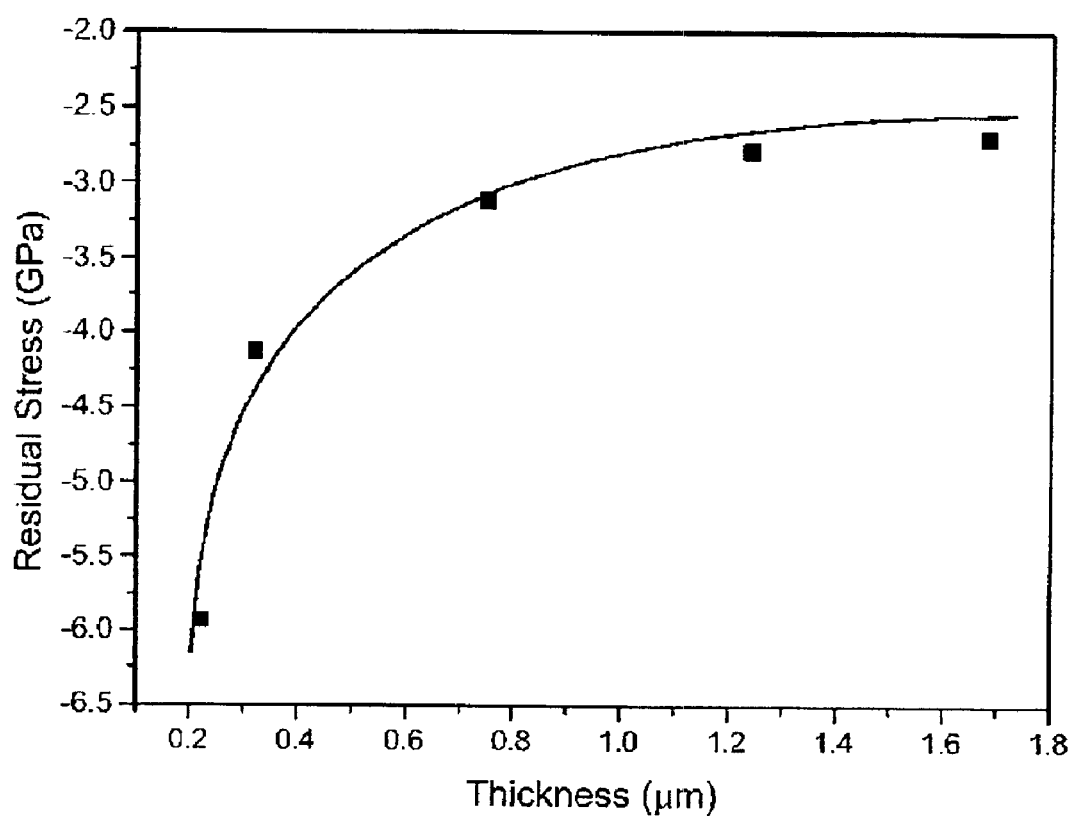
FIG. 18 shows that the compressive mechanical stress of Titanium nitride is non uniform and drops from 6000 MPa to 2700 MPa as the film thickness is increased from 0.2 $\mu m$ to 1.7 $\mu m$ (W. Chou, Surface and Coatings Technology 149 (2002) pp. 7–13)

FIG. 18 taken from W. Chou, G. Yu, J. Huang, 'Mechanical properties of TiN thin film coatings on 304 stainless steel Substrates', Surface and Coatings Technology 149 (2002) pp. 7–13, Research funded by the National Science Council of the Republic of China under the contracts NSC 89-2216-E-007-036 and NSC 88-301 1-B-007-001-NU; shows that the −6000 MPa compressive mechanical stress of their Titanium nitride films is not homogenous and varies from −6000 MPa to −2700 MPa when the thickness of the deposited layer is increased from 0.2 µm to 1.7 µm. This kind of stress gradient will cause problems with the upper sealing and stiffening layer of the underlying cavity.

The reference T. Matsue, T. Hanabusa, Y. Ikeuchi, Y. Miki and E. Maitani, 'Alteration of Residual Stress in TiN Film due to Heat Treatment', Society of Materials Science, JSMS, Vol.49 No.7 pp.735; shows that the −7100 to −6300 MPa compressive mechanical stress of their Titanium nitride films exhibiting the preferred (111) orientation is one order larger than the thermal residual stress expected from the thermal strain mismatch between the film and the substrate and can be decreased to about 1000 MPa following a long duration post-deposition thermal treatment at a temperature of 800° C. Again, this required post-deposition thermal treatment in not compatible with the underlying aluminum or aluminum alloy sealing the underlying vacuum cavity.

The reference B. Rauschenbach, J. W. Gerlash, 'Texture Development in Titanium Nitride Films Grown by Low-Energy Ion Assisted Deposition', Cryst. Res. Technol., Vol. 35, Vol. 6–7, 2000, pp. 675–688; shows that the compressive mechanical stress during ion assisted deposition of their Titanium nitride films on Si(111) is increasing from −1000 MPa to −4000 MPa when the Titanium nitride film thickness is increased from 50 nm to 300 nm.

The fabrication of a tensile stress high quality titanium nitride to be used as an upper sealing and stiffening layer over an aluminum or aluminum alloy is not a simple task because the deposition and post-deposition thermal treatments have to be limited to a temperature of less than about 450° C. to prevent problems with the underlying aluminum or aluminum alloy capping plate of the vacuum sealed underlying cavity.

Figure 19:
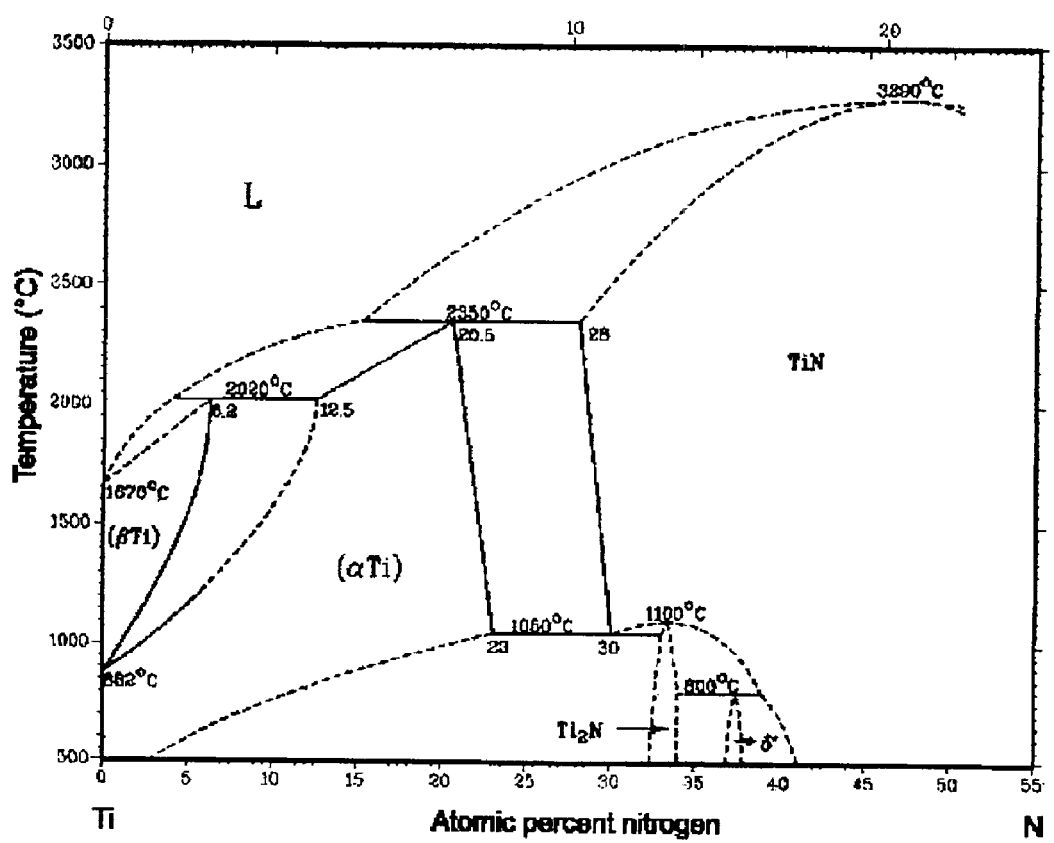
FIG. 19 is a Ti—N phase diagram at a temperature of about 500° C.

FIG. 19 shows the Ti—N phase diagram extracted from the reference E. Zoestbergen, 'Surface modification of titanium with lasers'. Thesis, Faculty of Science, University Library Groningen, May 8, 1998, ISBN 90 367 0893 1, Work part of the research program of IOP-Metalen (Den Haag) (IOP-C92617.RG.TN) and has been supported by the Foundation for Fundamental Research on Matter (FOM-Utrecht) and by the Netherlands Foundation for Technical Sciences (STW-Utrecht). The Ti—N phase diagram of FIG. 19 clearly shows that the reactive sputtering deposition of a titanium nitride layer at a temperature of less than about 500° C. can result in a complex mixture of phases and in mixtures of crystal orientations in the individual phases:

A hexagonal closed packed (hcp) α-Ti phase, characterized by (012) and (110) oriented α-Ti crystals, is obtained by reactive sputtering in an argon-nitrogen conditions of very serious nitrogen deficiency resulting in less than about 3 at % N incorporation in the obtained layer. In this case, nitrogen atoms do not yet form any compound within the titanium layer but only occupy titanium's interstitial octahedral sites, thus causing an increase of the lattice spacing and a more compressive stress. The ratio of the three possible orientations of the α-Ti crystals of this single phase material depends upon the sputtering conditions and controls the mechanical stress of the obtained layer. A texture analysis can be used to measure the ratios of the two crystals orientations and correlate to the mechanical stress. These single phase α-Ti layers are still silver in appearance and still have about the bulk resistivity of thin film titanium of about 80 µΩ.cm.

As the reactive sputtering conditions at less than about 500° C. are modified to allow more nitrogen to be incorporated into the deposited layer, a decrease of the lattice is observed with a decrease in the compressive stress and a second phase appears to be mixed with the α-Ti phase. This tetragonal ε-$Ti_2N$ phase, results from the progressive nitrogen consumption of the (012) hexagonal α-Ti crystals forming (111) tetragonal ε-$Ti_2N$ crystals and from the progressive nitrogen consumption of the (110) hexagonal α-Ti crystals forming (200) tetragonal ε-$Ti_2N$ crystals when the reactive sputtering conditions are progressively modified to incorporate between about 3 at % N and about 32.5 at % N in the obtained layer. Again, the ratio of the remaining (012) hexagonal α-Ti crystals; remaining (110) hexagonal α-Ti crystals; forming (111) tetragonal ε-$Ti_2N$ crystals; and forming (200) tetragonal ε-$Ti_2N$ crystals is really function of the reactive sputtering deposition conditions. Again, a texture analysis can be used to verify the ratio of all four coexisting crystals and correlate to the observed mechanical stress. At about 32.5 at % N, all of the α-Ti crystals are now consumed and only a single ε-$Ti_2N$ phase remains with the ratio of the remaining two crystal orientations depending upon the reactive sputtering conditions.

If the reactive sputtering conditions continue to be modified so as to increase even more the nitrogen incorporation in the deposited layer, the nitrogen atoms will again begin to occupy interstitial sites, thus again causing an increase in the lattice spacing and a more compressive stress. As long as the nitrogen incorporation remains between about 32.5 at % N and 34 at % N, the $\epsilon$-Ti$_2$N phase will be the only one. These single phase $\epsilon$-Ti$_2$N layers are silver-to-light-yellow in appearance and have a relatively high bulk resistivity of more than about 200–400 $\mu\Omega$.cm, or more.

As the reactive sputtering conditions at less than about 500° C. are again modified to allow more nitrogen to be incorporated into the deposited layer, a further decrease of the lattice is observed with a further decrease in the compressive stress and a second phase appears to be mixed with the $\epsilon$-Ti$_2$N phase. This more compact face centered cubic $\delta$-TiN phase results from the progressive nitrogen consumption of the (111) tetragonal $\epsilon$-Ti$_2$N crystals forming more compact (111) face centered cubic $\delta$-TiN crystals via the consumption of $\delta$'-TiN crystals and from the progressive nitrogen consumption of the (200) tetragonal $\epsilon$-Ti$_2$N crystals forming more compact (200) face centered cubic $\delta$-TiN crystals also via the consumption of $\delta$'-TiN crystals when the reactive sputtering conditions are progressively modified to incorporate between about 34 at % N and about 42 at % N in the obtained layer.

This compaction effect results in a very high compressive stress level. At about 42 at % N, all of the $\epsilon$-Ti$_2$N crystals (and intermediate $\delta$'-TiN crystals) are now consumed and only the more compact single $\delta$-TiN phase remains. Again, the evolution of the ratio of remaining (111) tetragonal $\epsilon$-Ti$_2$N crystals; remaining (200) tetragonal $\epsilon$-Ti$_2$N crystals; forming (111) face centered cubic $\delta$-TiN crystals; and forming (200) face centered cubic $\delta$-TiN crystals; is really function of the reactive sputtering deposition conditions and can be measured by a texture analysis and used to correlate the increasingly compressive mechanical stress observed as the reactive sputtering conditions continue to be modified so as to reach the point where all of the vacancies of the nitrogen face-centered cubic sub-lattice are satisfied with nitrogen atoms. To this stoichiometric $\delta$-TiN point is associated a maximum of the X-ray diffraction normalized intensities of the (111) face centered cubic $\delta$-TiN crystals and of the (200) face centered cubic $\delta$-TiN crystals. Because the 65 pm diameter of an nitrogen atom is smaller than the 140 pm diameter of a titanium atom, to this optimum stoichiometric $\delta$-TiN is also associated an optimum minima in the mechanical stress; i.e. increasing even more the nitrogen incorporation in the deposited layer will force nitrogen atoms to replace be incorporated between the titanium face-centered cubic sub-lattice and the nitrogen face-centered cubic sub-lattice, thus causing a re-increase of the compressive stress.

As long as the nitrogen incorporation remains between about 42 at % N and 66 at % N, the $\delta$-TiN phase will be the only one. Because these single phase $\delta$-TiN layers have a very characteristic shiny and attractive golden yellow appearance, because their thin film electrical resistivity at about 40 $\mu\Omega$.cm is about half that of $\alpha$-Ti layers and much lower than that of $\epsilon$-Ti$_2$N layers, and because the electrical resistivity of titanium nitride is very sensitive to vacancies in both the nitrogen and the titanium sub-lattices, it is very easy to verify that the obtained lower stress layer remains a single phase $\delta$-TiN.

Any attempt to increase the nitrogen incorporation too much toward and beyond the maximum of 66 at % N will result in a shift or its appearance toward a purple-brown color, in a higher bulk resistivity, in an increase in dislocation density.

Demonstration of a High Quality 300 MPa Tensile Stress Titanium Nitride

Figure 20:
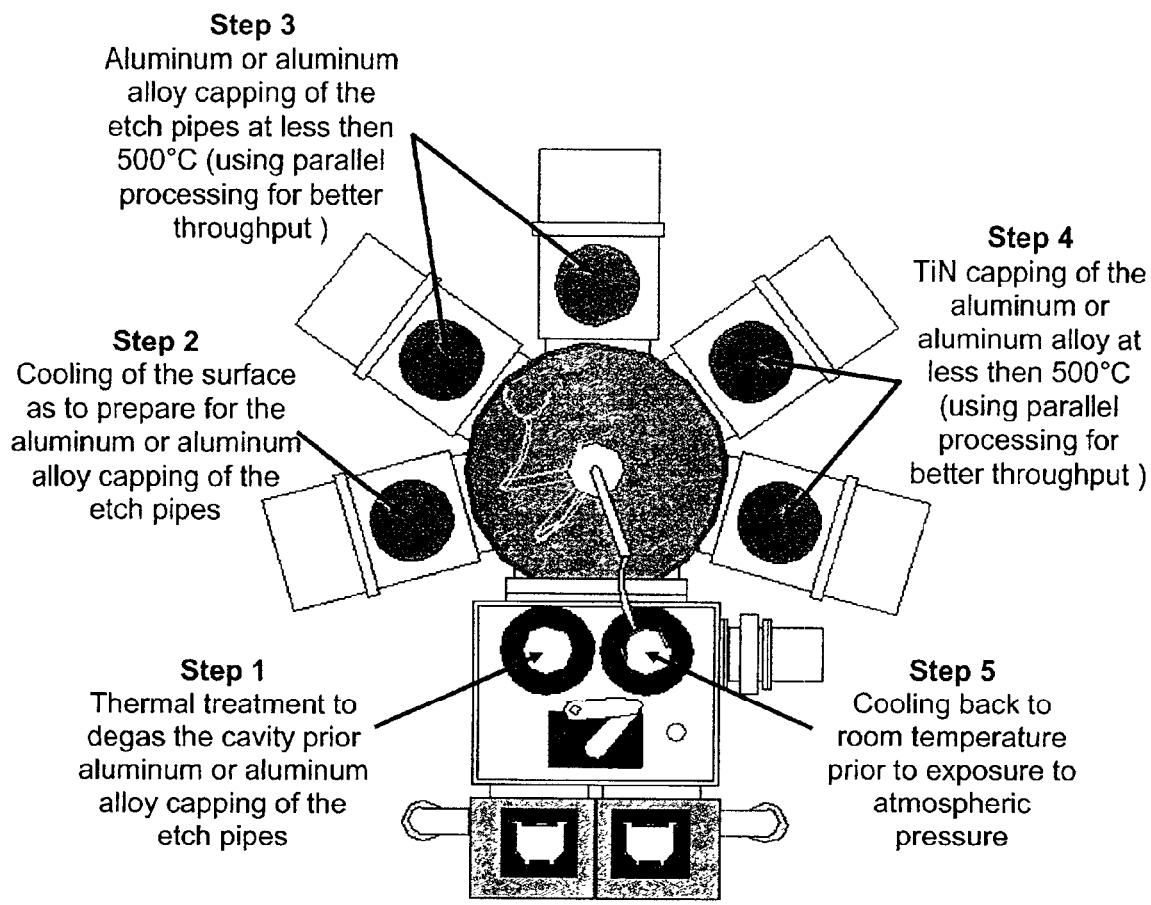
FIG. 20 shows the deposition sequence of the capping aluminum or aluminum alloy followed by the in-situ reactive sputtering deposition of the upper sealing and stiffening Titanium nitride layer at an optimized temperature of less than 500° C.

FIG. 20 shows the deposition sequence allowing the integration of the capping aluminum or aluminum alloy and of the in-situ reactively sputtered upper sealing and stiffening titanium nitride layer at an optimized temperature of less than 500° C.

Step 1: A thermal treatment is preferred to thoroughly degas the cavity prior to capping the etch pipes with the aluminum or aluminum alloy;

Step 2: Cooling and surface preparation of the wafer to prepare for the aluminum or aluminum alloy capping of the etch pipes;

Step 3: Capping of the etch pipes with the aluminum or aluminum alloy at a temperature of less than 500° C. To enhance throughput, a parallel processing approach is preferred;

Step 4: In-situ deposition of the upper sealing and stiffening titanium nitride layer by reactive sputtering at a maximum temperature of 500° C. Again, a parallel processing approach is preferred for enhanced throughput;

Step 5: Cooling to room temperature prior to exposing the resulting vacuum package to atmospheric pressure.

Figure 21:
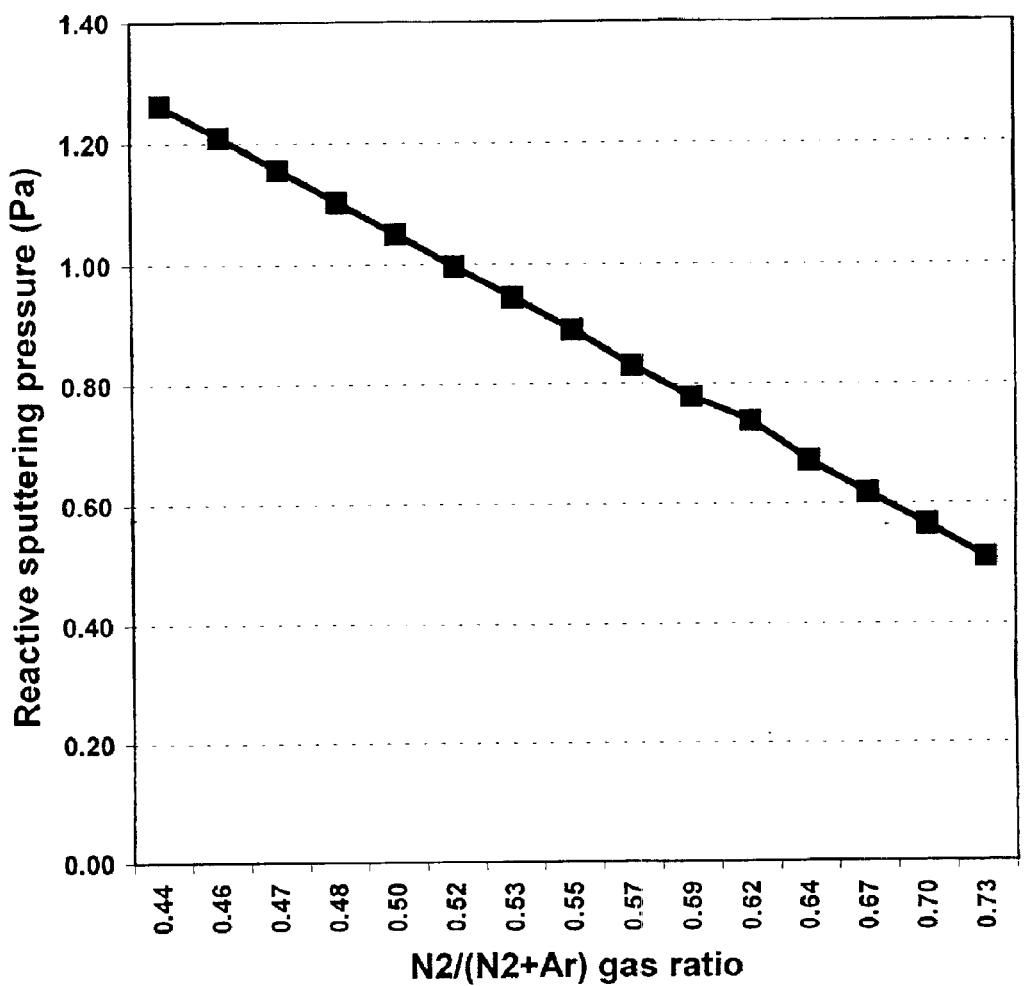
FIG. 21 shows the deposition condition variations of titanium nitride deposited by reactive sputtering at various temperatures and with no post-deposition thermal treatment.

FIG. 21 shows the deposition condition variations of various titanium nitride layers and demonstrates a tensile stress titanium nitride having the required characteristics for its use as an upper sealing and stiffening titanium nitride layer.

Figure 22:
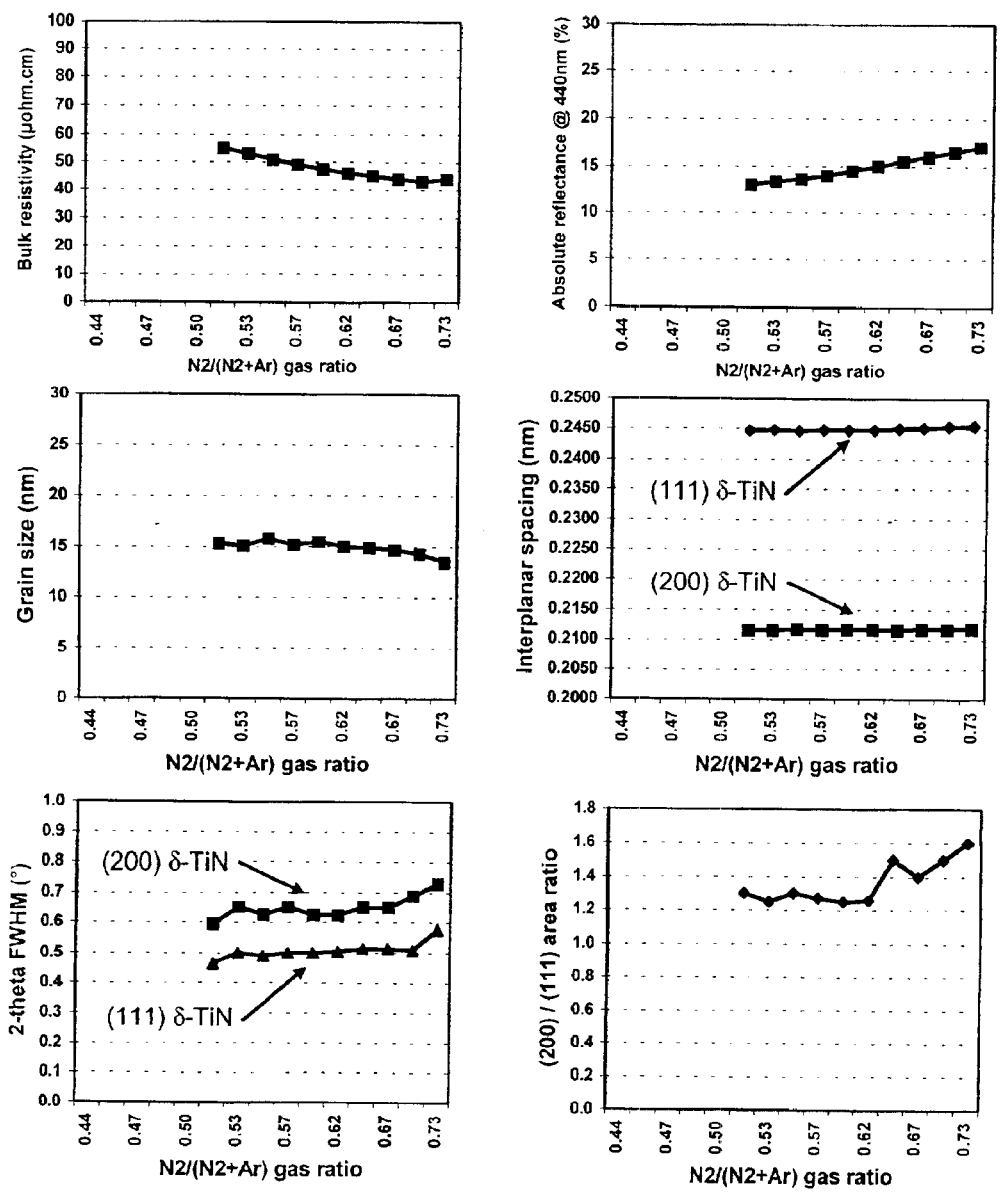
FIG. 22 shows the control of (111) and (200) δ-TiN crystals structures of titanium nitride deposited by reactive sputtering at 400° C. with no post-deposition thermal treatment.

FIG. 22 shows the effect of deposition conditions variations at a fixed temperature of 400° C. on the forming (111) and (200) face centered cubic $\delta$-TiN crystals (measured with an X-ray diffraction analyzer), on the grain structure (measured with the X-ray diffraction analyzer), on the bulk resistivity (measured with the combination of a Prometrix Omnimap RS35, a Tencor Alphastep 200 and a Kevex Omicron X-ray fluorescence analyzer), on the absolute reflectance characteristics (measured with a Prometrix Ft530) and on visual appearance. It is clear that all samples had the very characteristic shiny and attractive golden yellow appearance and that all samples were actually single phase $\delta$-TiN.

Figure 23:
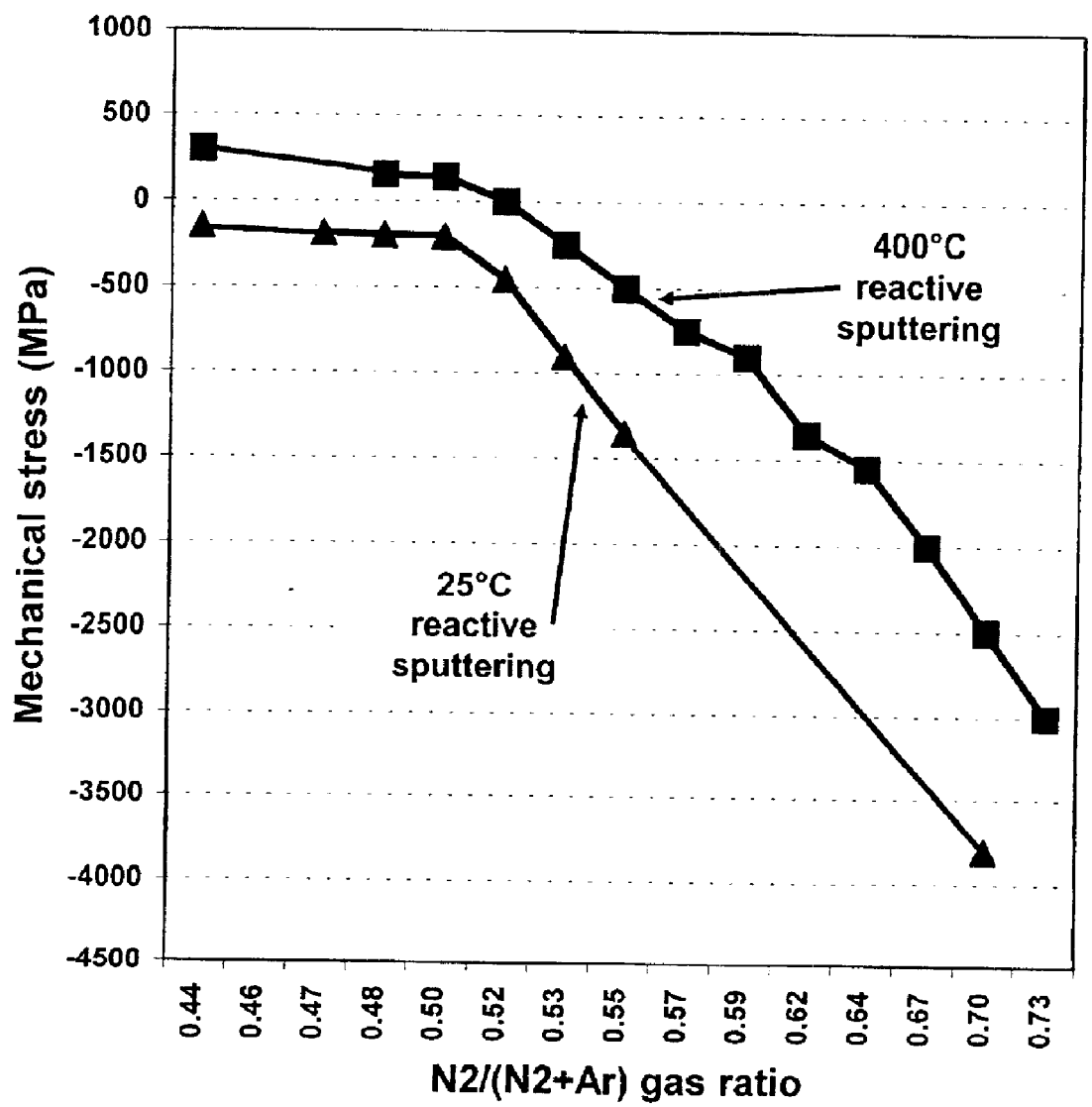
FIG. 23 shows the control of the mechanical stress of titanium nitride deposited by reactive sputtering at various temperature and with no post-deposition thermal treatment.

FIG. 23 shows the effect of these deposition conditions variations on the mechanical stress of the resulting single phase $\delta$-TiN layers. FIG. 23 shows that the optimized reactive sputter deposition is capable of producing the required tensile mechanical stress single phase $\delta$-TiN at a temperature of less than 400° C. and without a post-deposition thermal treatment. These optimized in-situ low temperature deposition conditions allow the protection of the underlying aluminum or aluminum alloy with a 0.2 $\mu$m to 10.0 $\mu$m and preferably 0.7 $\mu$m thick upper sealing and stiffening titanium nitride layer having a tensile mechanical stress lower than 1000 MPa and preferably of about 300 MPa prior to exposure of the vacuum sealed cavity to atmospheric pressure.

The use of this upper sealing and stiffening titanium nitride having a preferred 300 MPa tensile stress improves even more the rigidity of the underlying encapsulation structure. This improvement is the cumulative effect of the obtained hybrid structure composed of a preferably 5.0 $\mu$m thick and preferably 300 MPa tensile stress polysilicon; an upper preferably 2.0 $\mu$m thick and preferably 100 MPa tensile stress aluminum or aluminum alloy; and an upper, preferably 0.7 pm thick and preferably 300 MPa tensile stress, titanium nitride layer.

This improved hybrid structure will help the reliability of the sealing aluminum alloy, which experiences an important tensile stress following venting of the vacuum cavity to atmospheric pressure and prevent seal break if the aluminum alloy experiences a stress induced voiding over one of the etch pipes.

It will be appreciated by one skilled in the art that many variations of the invention are possible without departing from the scoped of the appended claims.

The invention is not limited to the described process for the fabrication of the underlying cavity. Another process capable of generating the underlying cavity can be used. The invention provides a sealed cover for whatever is to be protected underneath.

The release of the underlying cavity can be done, for example, by a wet buffered etch technique, by a dry isotropic etch or by other means than vapor HF.

The cavity can incorporate various devices, moving or not and can incorporate various types of devices including: integrated circuits requiring a low permittivity dielectric (vacuum), various moving MEMS (RF switches, gyros, accelerometers, photonics, biochips, actuators, motors, or other such moving micro-components), various static MEMS (sensors, ambient sensitive devices, or other such non-moving micro-components), biochips (drug delivery mechanisms or other biological or medical devices), or other devices in need of a temporary or permanent controlled environment or protection.

The invention is not limited to an underlying 5.0 $\mu$m thick polysilicon layer perforated with 1.0 $\mu$m etch pipes. In fact, the thickness of the underneath encapsulation structure could be preferably in the range between 0.25 $\mu$m and 25 $\mu$m.

The encapsulation structure could be perforated by etch pipes ranging from preferably 0.2 $\mu$m to 5.0 $\mu$m or by other shapes or means to reach the underlying cavity to be sealed.

The material of the encapsulation structure could have a different tensile stress than the preferred 300 MPa, in the range preferably between 10 MPa and 3000 MPa.

The clearance and/or cavity size below the encapsulation structure could be different from the specified one and range between 0.1 $\mu$m and up to the thickness of the substrate. If a 150 mm wafer is used as substrate, then the clearance and/or cavity size could reach about 600 $\mu$m.

The material of the encapsulation structure could be different from polysilicon and could be selected from one or a combination of the following: Titanium nitride, titanium aluminonitride, Molybdenum silicide, Titanium carbide, Silicon carbide, Tungsten, Aluminum nitride, Titanium aluminide, Molybdenum, Tantalum, Platinum, Tungsten silicide, Titanium, and/or Gold.

The fabrication technique for the encapsulation structure could be: LPCVD, PECVD, sputter deposition, reactive sputter deposition, ECR deposition, ICP deposition, MOCVD deposition or any other thin or thick film deposition technique.

The thickness of the sealing material could be different from the preferred minimum thickness of aluminum or aluminum alloy of about 50% more than the diameter of the etch pipes and very different from the preferred 2.0 $\mu$m in the range between 0.2 $\mu$m 20 $\mu$m. The sealing material itself could be any aluminum alloy with alloying elements such as copper, silicon, titanium, palladium or others. The sealing material could also be another easy-to-self-diffuse metal such as: copper, gold and silver. The sealing material could also be a low-temperature flowable dielectric capable of a reflow at a temperature of less than 500° C., such as high doping content borosilicates, arsenosilicates, germanosilicates or other similar vacuum deposited reflowable materials.

Depending upon the application, the required vacuum level in the sealed cavity underneath the sealed encapsulation structure could be different from the preferred 0.5 Pa, preferably in the range between 0.05 Pa and 5.0 Pa.

The sealing temperature of the encapsulation structure could be different from the preferred 450° C., and preferably in the range between 100° C. and 600° C.

The preferred titanium nitride sealing and stiffening layer could be different from the preferred thickness of 0.7 $\mu$m of stoichiometric, 600 GPa Young's modulus, 300 MPa tensile mechanical stress, 50 $\mu\Omega$.cm resistivity $\delta$-TiN and have a thickness ranging preferably between 0.2 $\mu$m and 10 $\mu$m, a different stoichiometry preferably between 32.5 at % N and 66 at % N, a different Young's modulus preferably between 70 GPa and 800 GPa, a different tensile stress preferably between 10 MPa and 3000 MPa, a different bulk resistivity preferably between 12 $\mu\Omega$.cm and 500 $\mu\Omega$.cm and a different phase structure preferably between a tetragonal $\epsilon$-Ti$_2$N and an over-stoichiometric $\delta$-TiN. In fact, the preferred sealing and stiffening layer could be different from titanium nitride and could be one or a combination of the following: Titanium nitride, titanium aluminonitride, Molybdenum silicide, Titanium carbide, Silicon carbide, Tungsten, Aluminum nitride, Titanium aluminide, Molybdenum, Tantalum, Platinum, Tungsten silicide, Titanium and/or Gold.

The deposition sequence allowing the integration of the capping aluminum or aluminum alloy followed and of the in-situ reactively sputtered upper sealing and stiffening titanium nitride layer can be very different from the preferred five step process at a preferred maximum temperature lower than 500° C. In particular, the degassing thermal treatment of the cavity prior to capping the etch pipes could be modified or eliminated. The cooling and surface preparation of the wafer in preparation for the aluminum or aluminum alloy capping of the etch pipes could be modified or eliminated. As previously mentioned, the capping of the etch pipes could be performed differently than with an aluminum or aluminum alloy at a temperature different than 500° C. and using an approach different from the preferred parallel processing approach. As also previously mentioned, the in-situ deposition of the upper sealing and stiffening could use a different material from the preferred titanium nitride, could use a different technique from the preferred reactive sputtering, could be performed at temperature different from the preferred maximum temperature of 500° C., and could use a processing approach different from the preferred parallel processing for enhanced throughput. The preferred cooling to room temperature prior to exposing the resulting vacuum package to atmospheric pressure could be modified or simply eliminated.

The contents of all references mentioned herein are incorporated by reference.

We claim:

1. A method of fabricating a microstructure with a vacuum-sealed cavity, comprising the steps of:
   fabricating said cavity in an encapsulation structure under a vacuum in a vacuum chamber;
   sealing said cavity with a capping layer; and
   depositing a stiff protective layer under tensile stress and having a Young's modulus of at least 70 Gpa on said capping layer prior to venting said vacuum chamber to atmospheric pressure.

2. A method as claimed in claim 1, wherein said capping layer is aluminum or an aluminum alloy deposited at a temperature of in the range 100 to 600° C.

3. A method as claimed in claim 2, wherein said capping layer is deposited at about 450° C.

4. A method as claimed in claim 2, wherein said stiff protective layer is titanium nitride.

5. A method as claimed in claim 4, wherein said titanium nitride is deposited at a maximum temperature of about 500° C.

6. A method as claimed in claim 5, wherein said titanium nitride is deposited by reactive sputtering.

7. A method as claimed in claim 6, wherein said titanium nitride is single phase δ-TiN deposited at a temperature of less than about 400° C.

8. A method as claimed in claim 7, wherein the thickness of said titanium nitride layer lies in the range of 0.2 to 10 μm.

9. A method as claimed in claim 8, wherein the thickness of said titanium nitride layer lies in the range of 0.2 to 0.7 μm.

10. A method as claimed in claim 9, wherein the thickness of said titanium nitride layer is about 0.7 μm.

11. A method as claimed in claim 9, wherein the thickness of said aluminum or aluminum alloy layer lies in the range 0.2 to 20 μm.

12. A method as claimed in claim 11, wherein the thickness of said aluminum or aluminum alloy layer is about 2.0 μm.

13. A method as claimed in claim 1, wherein said capping layer is selected from the group consisting of an aluminum alloy, wherein said aluminum is alloyed with an element selected from the group consisting of copper, silicon, titanium, and palladium.

14. A method as claimed in claim 1, wherein said capping layer is selected from the group consisting of copper, gold and silver.

15. A method as claimed in claim 1, wherein said capping layer is a flowable dielectric capable of reflow at a temperature of less than about 500° C.

16. A method as claimed in claim 15, wherein said capping layer is selected from the group consisting of borosilicates, arsenosilicates, and germanosilicates.

17. A method as claimed in claim 1, wherein said cavity is subjected to degassing prior to capping with said capping layer.

18. A method as claimed in claim 17, wherein said microstructure is cooled to room temperature after deposition of said protective layer prior to exposure to the atmosphere.

19. A method as claimed in claim 1, wherein said protective layer is selected from the group consisting of Titanium aluminonitride, TiAlN; Molybdenum silicide, $MoSi_2$; Titanium carbide, TiC; Silicon carbide, SiC; Tungsten, W; Aluminum nitride, AlN; Titanium aluminide, TiAl; Molybdenum, Mo; Tantalum, Ta; Platinum, Pt; Tungsten silicide, $WSi_2$; Titanium, Ti; Gold, Au.

20. A method as claimed in claim 1, wherein said encapsulation structure is polysilicon.

21. A method as claimed in claim 1, wherein said encapsulation structure is selected from the group consisting of titanium, titanium nitride, silicon nitride, tungsten, titanium tungsten, or combinations thereof.

22. A method of fabricating a microstructure with a vacuum-sealed cavity, comprising the steps of:
fabricating said cavity in an encapsulation structure under a vacuum in a vacuum chamber;
sealing said cavity with a capping layer of aluminum or aluminum alloy deposited at a maximum temperature of 500° C.; and
depositing in-situ a stiff protective layer of titanium nitride under tensile stress at a maximum temperature of 500° C. on said capping layer prior to venting said vacuum chamber to atmospheric pressure.

23. A method as claimed in claim 22, wherein said capping layer is deposited at a temperature of about 450° C.

24. A method as claimed in claim 22, wherein said protective layer is single phase δ-titanium nitride.

25. A method as claimed in claim 22, wherein said titanium nitride has a tensile stress lower than about 1000 MPa.

26. A method as claimed in claim 22, wherein the tensile stress of said titanium nitride is about 300 Mpa.

27. A method as claimed in claim 26, wherein said encapsulation structure is polysilicon having a tensile stress of about 300 Mpa.

28. A method as claimed in claim 22, wherein said cavity is degassed prior to being sealed with said capping layer.

29. A method as claimed 28, wherein said microstructure is cooled to room temperature prior to venting said vacuum chamber to the atmosphere.

* * * * *